United States Patent
Kim

(10) Patent No.: US 10,224,405 B2
(45) Date of Patent: Mar. 5, 2019

(54) MULTILAYER GRAPHENE, METHOD OF FORMING THE SAME, DEVICE INCLUDING THE MULTILAYER GRAPHENE, AND METHOD OF MANUFACTURING THE DEVICE

(71) Applicant: SAMSUNG ELECTRONICS CO., LTD., Suwon-si (KR)

(72) Inventor: Hyowon Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/371,387

(22) Filed: Dec. 7, 2016

(65) Prior Publication Data

US 2017/0179234 A1    Jun. 22, 2017

(30) Foreign Application Priority Data

Dec. 16, 2015    (KR) .................. 10-2015-0180193

(51) Int. Cl.
*H01L 29/16*    (2006.01)
*H01L 21/02*    (2006.01)
(Continued)

(52) U.S. Cl.
CPC .......... *H01L 29/1606* (2013.01); *B82Y 40/00* (2013.01); *C01B 32/186* (2017.08);
(Continued)

(58) Field of Classification Search
CPC .......... H01L 29/1606; H01L 21/02587; H01L 21/02579; H01L 21/02576;
(Continued)

(56) References Cited

U.S. PATENT DOCUMENTS

| 7,964,868 B2 | 6/2011 | Nakagawa et al. |
| 8,927,969 B2 * | 1/2015 | Bowers .................. H01L 21/04 257/29 |

(Continued)

FOREIGN PATENT DOCUMENTS

| EP | 3015426 A1 | 5/2016 |
| KR | 10-0984086 B1 | 9/2010 |

(Continued)

OTHER PUBLICATIONS

Nie, et al., "Growth from Below: Graphene Bilayers on Ir(111)", American Chemical Society, vol. 5, Issue No. 3, Feb. 15, 2011, pp. 2298-2306.
(Continued)

*Primary Examiner* — Latanya N Crawford
(74) *Attorney, Agent, or Firm* — Sughrue Mion, PLLC

(57) ABSTRACT

A multilayer graphene, a method of forming the same, a device including the multilayer graphene, and a method of manufacturing the device are provided. In the method of forming the multilayer graphene, a first graphene is formed on an underlayer, and then a multilayer graphene is formed by exposing two adjacent areas on the first graphene to a source gas. By differentiating temperatures and source gasses, the multilayer graphene has different electrical characteristics in the two adjacent areas.

51 Claims, 23 Drawing Sheets

(51) Int. Cl.
- H01L 29/66 (2006.01)
- H01L 29/786 (2006.01)
- B82Y 40/00 (2011.01)
- H01L 29/778 (2006.01)
- C01B 32/186 (2017.01)
- C01B 32/194 (2017.01)
- B82Y 30/00 (2011.01)
- H01L 29/167 (2006.01)

(52) U.S. Cl.
CPC ........ C01B 32/194 (2017.08); H01L 21/0262 (2013.01); H01L 21/02381 (2013.01); H01L 21/02444 (2013.01); H01L 21/02491 (2013.01); H01L 21/02502 (2013.01); H01L 21/02527 (2013.01); H01L 21/02576 (2013.01); H01L 21/02579 (2013.01); H01L 21/02587 (2013.01); H01L 29/66045 (2013.01); H01L 29/66977 (2013.01); H01L 29/778 (2013.01); H01L 29/78684 (2013.01); *B82Y 30/00* (2013.01); *C01B 2204/04* (2013.01); *H01L 29/167* (2013.01)

(58) Field of Classification Search
CPC ......... H01L 21/02502; H01L 21/02491; H01L 29/778; H01L 29/78684; H01L 29/66045; H01L 29/66977; H01L 21/0262; C01B 32/194; C01B 32/186; B82Y 40/00
See application file for complete search history.

(56) References Cited

U.S. PATENT DOCUMENTS

| | | | |
|---|---|---|---|
| 2010/0051897 A1 | 3/2010 | Chen et al. | |
| 2014/0054550 A1 | 2/2014 | Hong et al. | |
| 2014/0077162 A1* | 3/2014 | Bowers | H01L 21/04 257/29 |
| 2014/0231751 A1 | 8/2014 | Wada et al. | |
| 2015/0263280 A1* | 9/2015 | Miyazaki | H01L 45/1253 257/4 |
| 2016/0126317 A1* | 5/2016 | Kim | H01L 29/1606 257/29 |
| 2017/0077178 A1* | 3/2017 | Miyazaki | H01L 27/2418 |
| 2017/0323945 A1* | 11/2017 | Haque | H01L 29/1606 |

FOREIGN PATENT DOCUMENTS

| | | |
|---|---|---|
| KR | 10-2012-0099910 A | 9/2012 |
| KR | 10-2016-0051157 A | 5/2016 |

OTHER PUBLICATIONS

Zheng, et al., "Interfacial Properties of Bilayer and Trilayer Graphene on Metal Substrates", Scientific Reports, vol. 3, Article No. 2081, Jun. 27, 2013, pp. 1-11.

Iwasaki, et al., "Formation and structural analysis of twisted bilayer graphene on Ni(111) thin films", Surface Science, vol. 625, Mar. 12, 2014, pp. 44-49.

Communication dated Feb. 28, 2017, issued by the European Patent Office in counterpart European Application No. 16204332.7.

Dissanayake D. M. N. M. et al: "Chemical-free n-type and p-type multilayer-graphene transistors" Applied Physics Letters, vol. 109, No. 5, Aug. 1, 2016, XP012210037, (3 pages total).

S Wang, Y Sekine, S Suzuki, F Maeda, and H Hibino: "Photocurrent generation of a single-gate graphene p-n junction fabricated by interfacial modification", Nanotechnology, vol. 26, No. 38, 385203, Sep. 2, 2015, XP002767115, (7 pages total).

* cited by examiner

Nitrogen doped
Monolayer graphene

N-doped bilayer graphene

Graphene monolayer

MULTILAYER GRAPHENE, METHOD OF FORMING THE SAME, DEVICE INCLUDING THE MULTILAYER GRAPHENE, AND METHOD OF MANUFACTURING THE DEVICE

CROSS-REFERENCE TO RELATED PATENT APPLICATION

This application claims priority from Korean Patent Application No. 10-2015-0180193, filed on Dec. 16, 2015 in the Korean Intellectual Property Office, the disclosure of which is incorporated herein by reference in its entirety.

BACKGROUND

1. Field

The present disclosure relates to a multilayer graphene, a method of forming the same, a device including the multilayer graphene, and a method of manufacturing the device.

2. Description of the Related Art

Graphene is a hexagonal monolayer structure composed of carbon (C) atoms. Graphene is structurally and chemically stable and has good electrical and physical characteristics. For example, graphene has a charge mobility (e.g., about $2 \times 10^5$ cm$^2$/Vs) that is at least 100 times or higher than the charge mobility of silicon (Si), and a current density (e.g., about $10^8$ A/cm$^2$) that is at least 100 times higher than the current density of copper (Cu). Furthermore, graphene may have a very high Fermi velocity (VF). Graphene may include a monoatomic layer, or multilayer graphene may be formed by stacking several monoatomic layers on one another. As a result, graphene has drawn attention as a next-generation material that may overcome the limits of the materials in the related art.

Because of the various merits of graphene, research into applying graphene to several electronic devices has been conducted. In this connection, graphene needs to have semiconductor characteristics. However, it may be difficult to form graphene including a pn junction having good characteristics according to existing methods.

SUMMARY

One or more exemplary embodiments provide a multilayer graphene having good characteristics and physical properties, and a method of forming the multilayer graphene.

One or more exemplary embodiments also provide a multilayer graphene having good pn junction properties, and a method of forming the multilayer graphene.

One or more exemplary embodiments also provide a multilayer graphene having a narrow depletion region existing at a pn junction boundary, and a method of forming the multilayer graphene.

One or more exemplary embodiments also provide a patterned multilayer graphene and a method of forming the patterned multilayer graphene.

One or more exemplary embodiments also provide a multilayer graphene having a defect-free edge portion, and a method of forming the multilayer graphene.

One or more exemplary embodiments also provide a device (graphene-containing device) including the multilayer graphene.

One or more exemplary embodiments also provide a method of manufacturing the device including the multilayer graphene.

According to an aspect of an exemplary embodiment, a method of forming a multilayer graphene includes forming a first graphene on an underlayer; forming a first multilayer graphene on a first area of the first graphene at a first temperature by using a first source gas, the first multilayer graphene including a portion of the first graphene corresponding to the first area; and forming a second multilayer graphene on a second area of the first graphene adjacent to the first area at a second temperature by using a second source gas, the second multilayer graphene including a portion of the first graphene corresponding to the second area, wherein the first temperature and the second temperature are different from each other.

The first graphene may be a monolayer graphene. As another example, the first graphene may be a bilayer graphene, or a multilayer graphene including three or more layers.

At least one of the first multilayer graphene and the second multilayer graphene may be a bilayer graphene.

One of the first multilayer graphene and the second multilayer graphene may be of a p-type and the other may be of an n-type, and the first multilayer graphene and the second multilayer graphene may form a pn junction.

The first source gas and the second source gas may be the same. Each of the first source gas and the second source gas may include a nitrogen (N)-containing hydrocarbon compound. The N-containing hydrocarbon compound may include pyridine ($C_5H_5N$). The first temperature may be about 700° C. or greater, and the second temperature may be about 550° C. or less. The first graphene may be formed at the first temperature by using the first source gas.

The first multilayer graphene may be a p-type, and the second multilayer graphene may be an n-type.

The first multilayer graphene may be formed as a p type as a result of the doping effect of the underlayer, and the second multilayer graphene may be formed as an n-type due to an n-type dopant present in the second source gas.

The first source gas and the second source gas may be different from each other. For example, one of the first source gas and the second source gas may include a first hydrocarbon compound and the other may include a second hydrocarbon compound. The first hydrocarbon compound may not contain N, and the second hydrocarbon compound may contain N.

The method may further include forming a third multilayer graphene directly joined or indirectly joined to the first multilayer graphene or the second multilayer graphene, and the third multilayer graphene may be of a p type or an n type. For example, the first through third multilayer graphenes may form a pnp or npn structure.

The first multilayer graphene and the second multilayer graphene may both be of a p-type conductive type or an n-type conductive type and may have different doping concentrations from each other. The first source gas and the second source gas may be the same. Each of the first source gas and the second source gas may include an N-containing hydrocarbon compound. The N-containing hydrocarbon compound may include pyridine ($C_5H_5N$). The first temperature may be about 550° C. to about 800° C., and the second temperature may be about 550° C. or less. The first graphene may be formed at the first temperature by using the first source gas. The first multilayer graphene may be of an n-type, and the second multilayer graphene may be of an n+-type.

The first multilayer graphene may be formed using a first mask that exposes the first area of the first graphene, and the second multilayer graphene may be formed using a second mask that exposes the second area of the first graphene. Alternatively, the first and second multilayer graphenes may be randomly distributed.

The underlayer may include a catalyst metal. For example, the catalyst metal may include platinum (Pt) or gold (Au). As another example, the catalyst metal may include Al, Ag, Cu, Ti, Co, Ni, or Pd.

The forming of the underlayer may include forming a first material layer on a substrate and forming a plurality of underlayers spaced apart from one another by patterning the first material layer.

According to an aspect of another exemplary embodiment, a method of forming a multilayer graphene includes forming a first graphene on an underlayer; forming a first multilayer graphene on a first area of the first graphene at a first temperature by using a first source gas, the first multilayer graphene including a portion of the first graphene corresponding to the first area; and forming a second multilayer graphene on a second area of the first graphene adjacent to the first area at a second temperature by using a second source gas, the second multilayer graphene including a portion of the first graphene corresponding to the second area, wherein the first source gas and the second source gas are different from each other. The first graphene may be a monolayer graphene. As another example, the first graphene may be a bilayer graphene, or a multilayer graphene including three or more layers. At least one of the first multilayer graphene and the second multilayer graphene may be a bilayer graphene. One of the first source gas and the second source gas may include a first hydrocarbon compound and the other may include a second hydrocarbon compound. The first hydrocarbon compound may not contain N, and the second hydrocarbon compound may contain N. The first multilayer graphene may be formed as a p-type by the first hydrocarbon compound, and the second multilayer graphene may be formed as an n-type by the second hydrocarbon compound. The first hydrocarbon compound may include at least one of benzene ($C_6H_6$), ethylene ($C_2H_4$), acetylene ($C_2H_2$), and triethylborane ($C_6H_{15}B$). The first hydrocarbon compound may contain boron (B). The second hydrocarbon compound may include pyridine ($C_6H_5N$). The first graphene may be formed using the first hydrocarbon compound.

According to an aspect of another exemplary embodiment, a method of forming a multilayer graphene includes forming a first graphene on an underlayer; and forming a multilayer graphene on a first area of the first graphene at a first temperature by using a first source gas, the multilayer graphene including a portion of the first graphene corresponding to the first area. The temperature used to form the first graphene is different from the first temperature, or the source gas used to form the first graphene is different from the first source gas. The first graphene may be a monolayer graphene, and the multilayer graphene may be a bilayer graphene. As another example, the first graphene may be a bilayer graphene, or a multilayer graphene including three or more layers. One of the first graphene and the multilayer graphene may be of a p-type and the other may be of an n-type, and the first graphene and the multilayer graphene may form a pn junction.

According to an aspect of the another exemplary embodiment, a method of manufacturing a graphene-containing device includes forming a multilayer graphene; and forming a device unit including the multilayer graphene. The forming of the multilayer graphene includes forming a first graphene on an underlayer; forming a first multilayer graphene on a first area of the first graphene at a first temperature by using a first source gas, the first multilayer graphene including a portion of the first graphene corresponding to the first area; and forming a second multilayer graphene on a second area of the first graphene adjacent to the first area at a second temperature by using a second source gas, the second multilayer graphene including a portion of the first graphene corresponding to the second area. The first temperature and the second temperature are different from each other, or the first source gas and the second source gas are different from each other.

According to an aspect of another exemplary embodiment, a method of manufacturing a graphene-containing device includes forming a multilayer graphene; and forming a device unit comprising the multilayer graphene. The forming of the multilayer graphene includes forming a first graphene on an underlayer; and forming a first multilayer graphene on a first area of the first graphene at a first temperature by using a first source gas, the first multilayer graphene including a portion of the first graphene corresponding to the first area. The temperature at which the first graphene is formed is different from the first temperature, or the source gas used to form the first graphene is different from the first source gas.

The multilayer graphene may be formed on a first substrate, and the device unit may be formed on a second substrate after the multilayer graphene is transferred from the first substrate to the second substrate. Alternatively, the multilayer graphene may be formed on the first substrate, and the device unit may also be formed on the first substrate.

According to an aspect of another exemplary embodiment, a graphene-containing device includes a multilayer graphene formed by using a method including forming a first graphene on an underlayer; forming a first multilayer graphene on a first area of the first graphene at a first temperature by using a first source gas, the first multilayer graphene including a portion of the first graphene corresponding to the first area; and forming a second multilayer graphene on a second area of the first graphene adjacent to the first area at a second temperature by using a second source gas, the second multilayer graphene including a portion of the first graphene corresponding to the second area, wherein the first temperature and the second temperature are different from each other or the first source gas and the second source gas are different from each other.

According to an aspect of another exemplary embodiment, a graphene-containing device includes a multilayer graphene formed by using a method including forming a first graphene on an underlayer; and forming a first multilayer graphene on a first area of the first graphene at a first temperature by using a first source gas, the first multilayer graphene including a portion of the first graphene corresponding to the first area, wherein the temperature at which the first graphene is formed is different from the first temperature or the source gas used to form the first graphene is different from the first source gas.

The graphene-containing device may be a diode, and the graphene-containing device may further include a first electrode connected to the first multilayer graphene and a second electrode connected to the second multilayer graphene.

The graphene-containing device may be a transistor, and the multilayer graphene may be used as a channel layer. The multilayer graphene may have a pnp or npn structure.

The graphene-containing device may include one of a tunneling device, a binary junction transistor (BJT), a barristor, a field effect transistor (FET), a memory device, a solar cell, a photodetector, a sensor, and a light-emitting device.

According to an aspect of another exemplary embodiment, a graphene device includes a multilayer graphene, the multilayer graphene including an n-type multilayer graphene formed on a first area; and a p-type multilayer graphene formed on a second area adjacent to the first area, wherein the n-type multilayer graphene has a crystal structure in which some of carbon (C) atoms are replaced by first atoms, and the p-type multilayer graphene has a crystal structure including only C atoms or has a crystal structure in which some of C atoms are replaced by second atoms different from the first atoms. The multilayer graphene may be a bilayer graphene. The first atoms may be N atoms.

BRIEF DESCRIPTION OF THE DRAWINGS

The above and/or other aspects will become apparent and more readily understood from the following description of exemplary embodiments, taken in conjunction with the accompanying drawings in which.

DETAILED DESCRIPTION

Figure 1A:
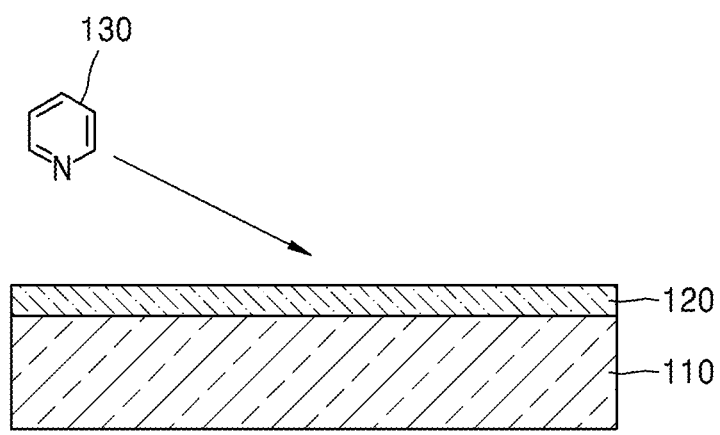
FIGS. 1A-1F are cross-sectional views illustrating a method of forming a multilayer graphene, according to an exemplary embodiment.

A multilayer graphene, a method of forming the same, a device including the multilayer graphene, and a method of manufacturing the device will now be described in detail with reference to the accompanying drawings. Like reference numerals in the drawings denote like elements, and, in the drawings, the sizes of elements may be exaggerated for clarity and for convenience of explanation. It will be understood that when a material layer is referred to as being "formed on" or "adjacent to" a substrate, an area, an item, or another layer, it can be directly or indirectly formed on or adjacent to the substrate, area, item, or other layer. That is, for example, intervening substrates, areas, items, or layers may be present. Materials that constitute each layer in exemplary embodiments below are exemplary, and thus the other materials may be used.

FIGS. 1A-1F are cross-sectional views illustrating a method of forming a multilayer graphene, according to an exemplary embodiment.

Referring to FIG. 1A, a substrate 110 having an underlayer 120 formed thereon is prepared. The substrate 110 may be, for example, a silicon (Si) substrate, but may be any other suitable substrate. The underlayer 120 may be a material layer including a catalyst for forming graphene on the material layer. The catalyst may be a metal. Accordingly, the underlayer 120 may be referred to as a catalyst metal layer. For example, the underlayer 120 may include platinum (Pt) as the catalyst. In such a case, the underlayer 120 may be a Pt layer.

Figure 1B:
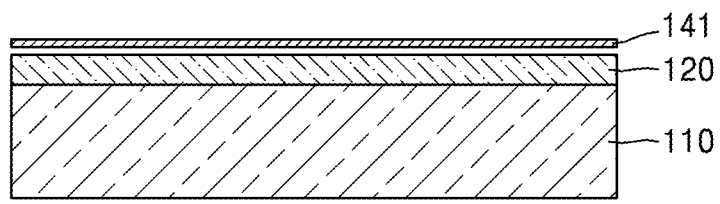

Next, a graphene forming process may be conducted at a first temperature T10 by using a first source gas 130. The first source gas 130 may be injected into a chamber including the substrate 110 to adsorb the material of the first source gas 130 to an exposed area (namely, a first area) of the underlayer 120. The substrate 110 or the chamber may be heated to the first temperature T10. The injection of the first source gas 130 may be followed by the heating, or the heating may be followed by the injection of the first source gas 130. Alternatively, the heating and the injection may be conducted simultaneously. As a result, as shown in FIG. 1B, a first graphene 141 may be formed on the underlayer 120. The first graphene 141 may be formed as a monolayer (a monoatomic layer) by, for example, adjusting the duration of the heating.

A process of forming the first graphene 141 in FIGS. 1A and 1B may be a sort of chemical vapor deposition (CVD). The formation of the first graphene 141 by using the first source gas 130 and the first temperature T10 will be described later in more detail.

Figure 1C:
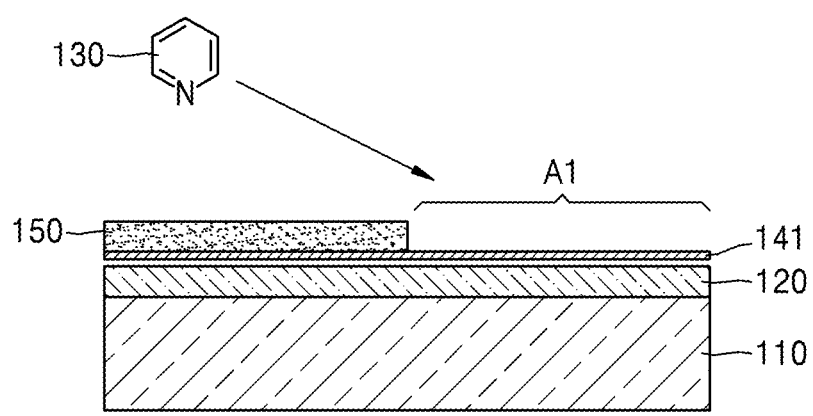

Referring to FIG. 1C, a first mask layer 150 may be formed on the substrate 110 so as to leave open a first area A1 of the first graphene 141 and so as to cover the remaining area thereof. The first mask layer 150 may be formed from metal, a metal compound, oxide, nitride, or the like, or may be formed from polymer that is usable at a relatively high temperature (for example, about 500° C. or greater).

Next, a first multilayer graphene forming process may be conducted at the first temperature T10 by using the first source gas 130. The first source gas 130 may be injected into the chamber, and the substrate 110 or the chamber may be heated to the first temperature T10. Similar to the aforementioned example, the injection of the first source gas 130 may be followed by the heating, or the heating may be followed by the injection of the first source gas 130, or the heating and the injection may be conducted simultaneously. Consequently, the material of the first source gas 130 may be adsorbed to the underlayer 120 via a first graphene 141a (see FIG. 1D) of the first area A1 to thereby form additionally a second graphene 142 (see FIG. 1D). Accordingly, a first multilayer graphene 140a may be formed in the first area A1. The second graphene 142 formed in the first area Al may also be a monolayer graphene. In this case, the first multilayer graphene 140a may be a bilayer graphene.

Figure 1D:
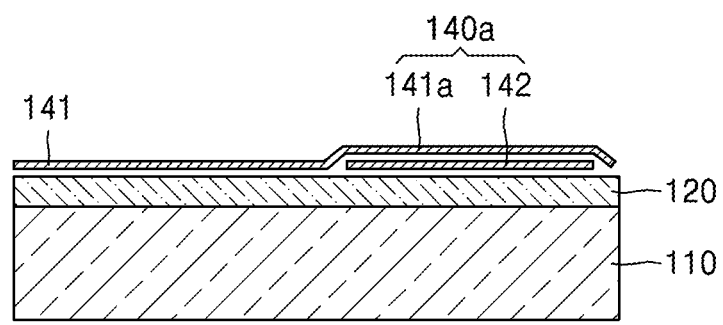

Next, as shown in FIG. 1D, the first mask layer 150 of FIG. 1C is removed.

Figure 1E:
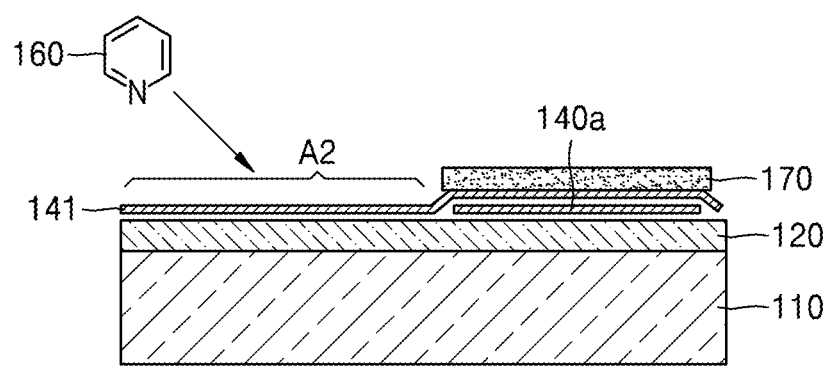

Next, as shown in FIG. 1E, a second mask layer 170 is formed on the first multilayer graphene 140a so as to cover the first multilayer graphene 140a. The second mask layer 170 exposes a second area A2 of the first graphene 141, the second area A2 including no first multilayer graphenes 140a. The second area A2 may be adjacent to the first area A1.

Next, a second graphene forming process may be conducted on the second area A2 of the first graphene 141, which is not covered with the second mask layer 170 and which is exposed, by using a second source gas 160 at a second temperature T20.

Figure 1F:
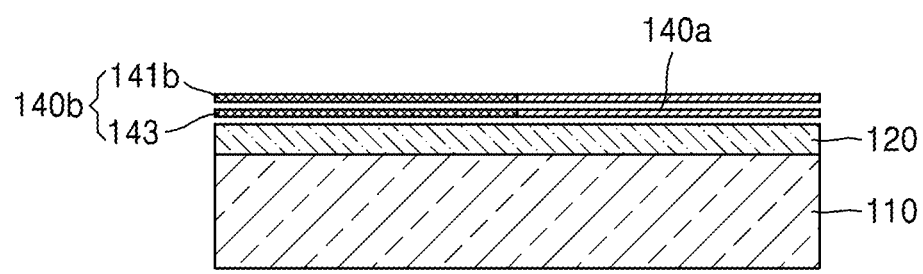

The second source gas 160 may be injected into the chamber including the substrate 110, and the substrate 110 or the chamber may be heated to the second temperature T20. The injection of the second source gas 160 may be followed by the heating, or the heating may be followed by the injection of the second source gas 130, or the heating and the injection may be conducted simultaneously. Consequently, the material of the second source gas 160 may be adsorbed to the underlayer 120 via a first graphene 141b (see FIG. 1F) of the second area A2 to thereby form a third graphene 143 (see FIG. 1F). Accordingly, as shown in FIG. 1F, a second multilayer graphene 140b may be formed in the second area A2. The third graphene 143 formed in the second area A2 may also be a monolayer graphene. In this case, the second multilayer graphene 140b may be a bilayer graphene.

Since the first and second multilayer graphenes 140a and 140b are respectively formed in the first and second areas A1 and A2 adjacent to each other, the first and second multilayer graphenes 140a and 140b contact each other on the same plane. In other words, the second multilayer graphene 140b may be joined to a lateral surface of the first multilayer graphene 140a.

According to the present exemplary embodiment, the first source gas 130 of FIGS. 1A and 1C may be the same as the second source gas 160 of FIG. 1E. In this case, the first source gas 130 and the second source gas 160 may include a nitrogen (N)-containing hydrocarbon compound. The N-containing hydrocarbon compound may include, for example, pyridine ($C_5H_5N$). In other words, both the first source gas 130 and the second source gas 160 may be a pyridine ($C_5H_5N$) gas. Even when the same source gases 130 and 160 are used as described above, first and second multilayer graphenes 140a and 140b having different semiconductor types may be formed, as will be described later, by using different process temperatures T10 and T20. The first temperature T10 for forming the first graphene 141 or the first multilayer graphene 140a may be about 700° C. or greater, and the second temperature T20 for forming the second multilayer graphene 140b may be about 550° C. or less. In more detail, the first temperature T10 may be about 700° C. to about 1200° C., and the second temperature T20 may be about 450° C. to about 550° C.

In FIGS. 1A and 1C, when the first source gas 130 includes pyridine ($C_5H_5N$) and the first temperature T10 is about 700° C. or greater, not only the hydrogen (H) in pyridine, but also the N in pyridine may be dissolved and removed at this high temperature. Accordingly, the first multilayer graphene 140a of FIG. 1C may not include N atoms. Since N atoms may serve as an n-type dopant for graphene, the N atoms may not be included in the first multilayer graphene 140a. In this case, the first multilayer graphene 140a may be p-type graphene as a result of a doping effect caused by the underlayer 120.

Figure 2:
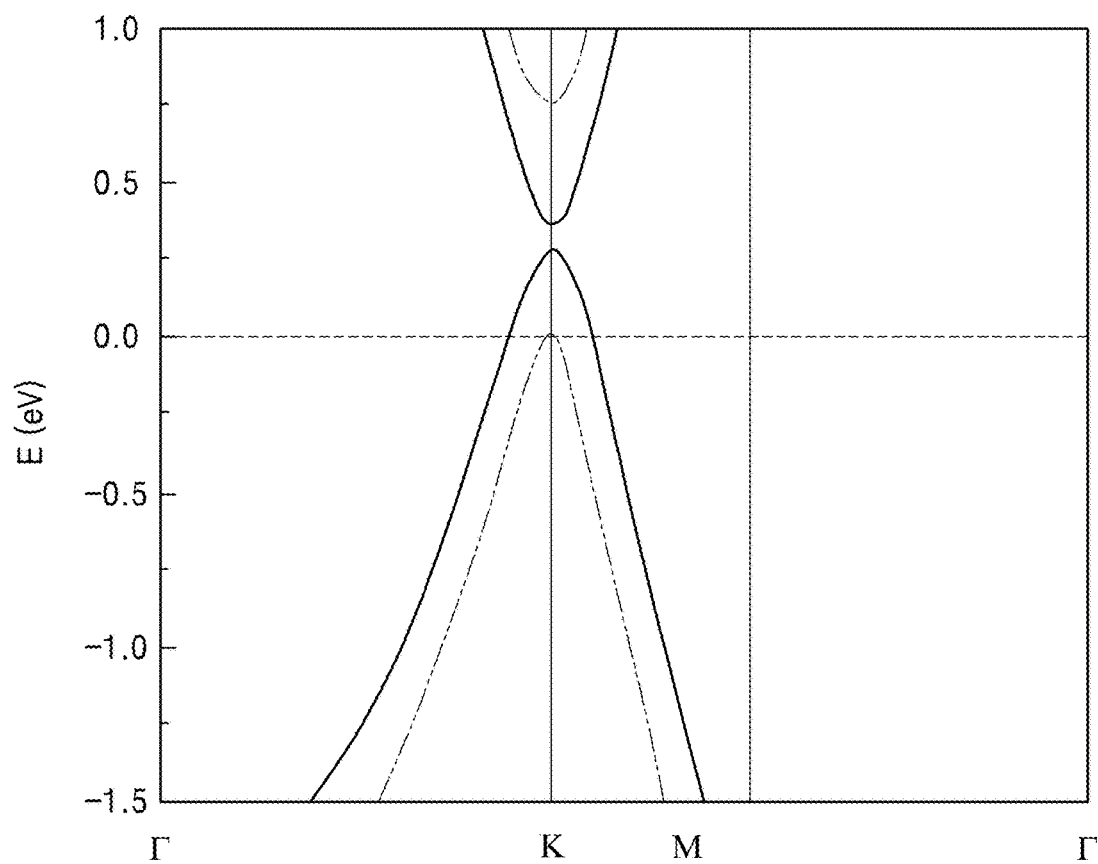
FIG. 2 is a diagram showing the energy band structure of a first bilayer graphene illustrated in FIG. 1D.

FIG. 2 is a diagram showing the structure of a dominant energy band of a bilayer graphene. The Fermi level was set to zero. Referring to FIG. 2, the bilayer graphene has a bandgap structure. This may be understood as having a bandgap while the symmetry of the electrical interaction of carbon (C) atoms is collapsed as the graphene forms a bilayer. When the bilayer graphene is formed on Pt, the intermediate value of the bandgap of the bilayer graphene increases by several hundreds of mV (for example, about 300 mV) with respect to the Fermi level due to the Pt. As described above, the first multilayer graphene 140a may be a bilayer graphene. In this case, as shown in FIG. 2, the first multilayer graphene 140a (bilayer graphene) may have bandgap opening with p-type semiconductor characteristics. Many Si-based semiconductor devices use the bandgap property of semiconductors. However, a monolayer graphene has a zero bandgap because the π-band and the π+-half-filled band meet at the Dirac points, and, even when the Dirac points are moved upwards or downwards from the Fermi level by doping the monolayer graphene, the zero bandgap is continuously maintained. Accordingly, there is a limit in applying, without changes, such a monolayer graphene to many existing Si-based semiconductor devices. However, a multilayer graphene 140 (bilayer graphene) (see, e.g., FIG. 3) manufactured according to the present exemplary embodiment opens a bandgap as a result of a bilayer structure, and thus existing bandgap characteristics of semiconductors that have been used in the existing art may also be used. In FIG. 1E, when the second source gas 160 includes pyridine and the second temperature T20 is about 550° C. or less, the N in the pyridine may not be removed at this relatively low temperature, and may be used together with C to form the third graphene 143 of FIG. 1F. Even when the first temperature T10 is about 700° C. or greater, and thus most of the N atoms of the first graphene 141 are removed in FIGS. 1A and 1C, the N of the pyridine permeates into the first graphene 141 of the second area A2 in the second multilayer graphene forming process of FIG. 1E, and thus, as shown in FIG. 1F, the first graphene 141b of the second area A2 is doped with N atoms. Accordingly, the second multilayer graphene 140b of FIG. 1F may include N atoms. Since the N atoms may be an n-type dopant, the second multilayer graphene 140b may have n-type semiconductor characteristics due to the N atoms. Similar to the above description, the second multilayer graphene 140b may be formed as a bilayer. In this case, the second multilayer graphene 140b may have a bandgap structure as a result of a bilayer effect. In other words, the second multilayer graphene 140b may have bandgap opening with n-type semiconductor characteristics.

By adjusting the second temperature T20, the doping concentration of the second multilayer graphene 140b may be adjusted, because the amount of N atoms included in the second multilayer graphene 140b varies depending on the second temperature T20. As the second temperature T20 decreases (for example, being closer to about 450° C.), the n-doping concentration of the second graphene 140b may increase. On the other hand, as the second temperature T20 increases (for example, being closer to about 550° C.), the n-doping concentration of the second multilayer graphene 140b may decrease. Accordingly, the doping concentration of the second multilayer graphene 140b may be easily controlled by adjusting the second temperature T20 within a predetermined range.

As such, since one type of source gas is used, but different process temperatures are used in a graphene growth operation, p-type and n-type multilayer graphenes (i.e., 140a and 140b) may be very easily formed. Since one type of source gas is used, the process is simplified, leading to reductions in manufacturing costs and manufacturing duration. A junction, namely, a pn junction, between the p-type and n-type multilayer graphenes (i.e., 140a and 140b) formed according to a method as described above may have good characteristics. Since the p-type and n-type multilayer graphenes (i.e., 140a and 140b) may have a defect-free structure or a structure having little defect, the multilayer graphene 140 including the p-type and n-type multilayer graphenes 140a and 140b may have good characteristics and physical properties. The crystalline structure and features of the multilayer graphene 140 will be described in more detail later with reference to FIG. 10 and the like.

When the first multilayer graphene 140a is formed and in this state the second multilayer graphene 140b is formed using the second source gas 160 and the second temperature T20, C atoms move toward the most energetically stable place. In this respect, the second multilayer graphene 140b may grow from the lateral surface of the first multilayer graphene 140a. Accordingly, the boundary between the first multilayer graphene 140a and the second multilayer graphene 140b may have no or little defects. In other words, the bond between the first multilayer graphene 140a and the second multilayer graphene 140b may approximate to a chemical bond. Accordingly, the first multilayer graphene 140a and the second multilayer graphene 140b may be considered to form a pn junction. The first multilayer graphene 140a and the second multilayer graphene 140b may constitute the multilayer graphene 140 of FIG. 3. In other words, the multilayer graphene 140 may be considered to have a pn junction structure.

Although the underlayer 120 includes Pt as a catalyst material in the present exemplary embodiment, embodiments of the present disclosure are not limited thereto. For example, even when the underlayer 120 includes gold (Au) as a catalyst, the bandgap of the first multilayer graphene 140a may increase with respect to the Fermi level due to the Au in the underlayer 120, and thus the first multilayer graphene 140a may have a p-type conductivity.

As another example, when the underlayer 120 includes a metal catalyst such as Al, Ag, Cu, Ti, Co, Ni, or Pd, the bandgap of the first multilayer graphene 140a may decrease with respect to the Fermi level and thus the first multilayer graphene 140a may have an n-type conductivity. In this case, by appropriately selecting the second source gas 160 and the second temperature T20, the first multilayer graphene 140a and the second multilayer graphene 140b may have a n-n+junction or an np junction.

Figure 3:
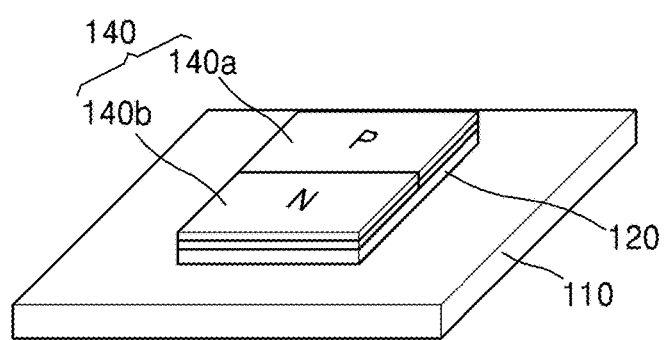
FIG. 3 is a perspective view of a multilayer graphene formed according to the method according to the exemplary embodiment of FIGS. 1A-1D.

FIG. 3 is a perspective view of the multilayer graphene 140 completely formed using the method according to the present exemplary embodiment. Referring to FIG. 3, the multilayer graphene 140 includes the first and second multilayer graphenes 140a and 140b. The multilayer graphene 140 may be formed on the underlayer 120 on the substrate 110. As described above, the first and second multilayer graphenes 140a and 140b may be cemented together in a lateral direction. The first multilayer graphene 140a may be a first type semiconductor, and the second multilayer graphene 140b may be a second type semiconductor. As described above, since the first multilayer graphene 140a has a bandgap-open p-type conductivity and the second multilayer graphene 140b has a bandgap-open n-type conductivity, the first and second multilayer graphenes 140a and 140b may form a pn junction.

According to the present exemplary embodiment, the first graphene 141 is a monolayer graphene, and the first multilayer graphene 140a and the second multilayer graphene 140b are bilayer graphenes. However, the embodiments of the present disclosure are not limited thereto. Thus, the first graphene 141 may be grown as a bilayer or a multilayer of three or more layers by, for example, adjusting the duration of the heating process. Similarly, each of the second and the third graphenes 142 and 143 may be grown as a bilayer or a multilayer of three or more layers. When the first graphene 141 is a bilayer graphene and each of the second and the third graphenes 142 and 143 is a monolayer graphene, the first multilayer graphene 140a and the second multilayer graphene 140b may be trilayer graphenes. Alternatively, when the first graphene 141 is a monolayer graphene and each of the second and the third graphenes 142 and 143 is a bilayer graphene, the first multilayer graphene 140a and the second multilayer graphene 140b may be trilayer graphenes. The electrical characteristics of such a trilayer graphene vary with the stacking order. For example, a Bernal (ABA stack type) trilayer graphene has semi-metallic characteristics having a tunable band. Also, a rhombohedral (ABC stack type) trilayer graphene has semiconductor characteristics having a tunable bandgap. As another example, the first graphene 141 may be formed as a monolayer graphene and the second and the third graphenes 142 and 143 may be formed as multilayer graphenes, or the first graphene 141 may be formed as a multilayer graphene and the second and the third graphenes 142 and 143 may be formed as monolayer graphenes, or all of the first graphene 141 and the second and the third graphenes 142 and 143 may be multilayer graphenes. As another example, the number of layers included in the first multilayer graphene 140a may be different from the number of layers included in the second multilayer graphene 140b. It will be understood by one of ordinary skill in the art that the number of layers included in the first graphene 141 and the number of layers included in each of the second and the third graphenes 142 and 143 may be appropriately selected according to desired characteristics.

According to the present exemplary embodiment, the p-type and n-type multilayer graphenes (i.e., 140a and 140b) are formed using the same source gases 130 and 160. However, according to another exemplary embodiment, the p-type and n-type multilayer graphenes (i.e., 140a and 140b) may be formed using different source gases. This exemplary embodiment is illustrated in FIGS. 4A-4F.

FIGS. 4A-4F are cross-sectional views illustrating a method of manufacturing a multilayer graphene, according to another exemplary embodiment.

Figure 4A:
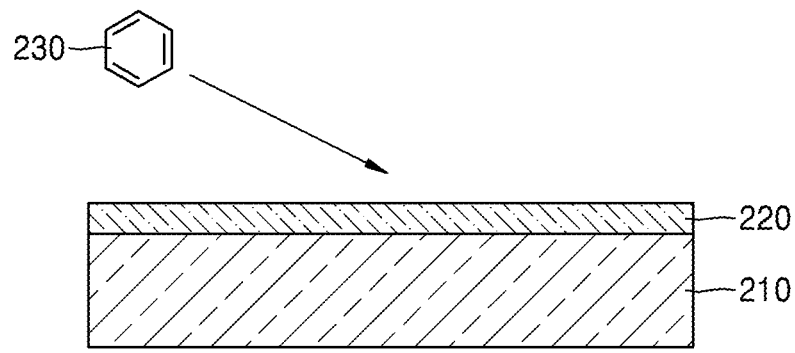
FIGS. 4A-4F are cross-sectional views illustrating a method of manufacturing a multilayer graphene, according to another exemplary embodiment.
Figure 4B:
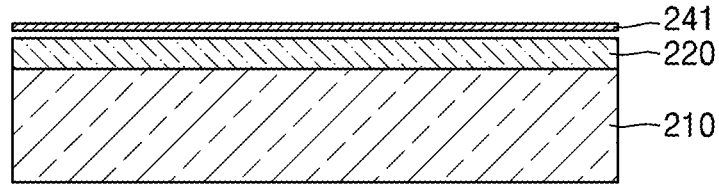

Referring to FIG. 4A, a substrate 210 on which an underlayer 220 is formed is prepared. The underlayer 220 may include a catalyst such as Pt, Ni, Cu, Ir, or the like. As shown in FIG. 4B, a first graphene 241 is formed on the underlayer 220 by using a first source gas 230 at a first temperature T11. The first graphene 141 may be formed as a monolayer (monoatomic layer) by, for example, adjusting the duration of a heating process. The first graphene 141 may also be grown as a bilayer or a multilayer of three or more layers by, for example, extending the duration of the heating process.

Figure 4C:
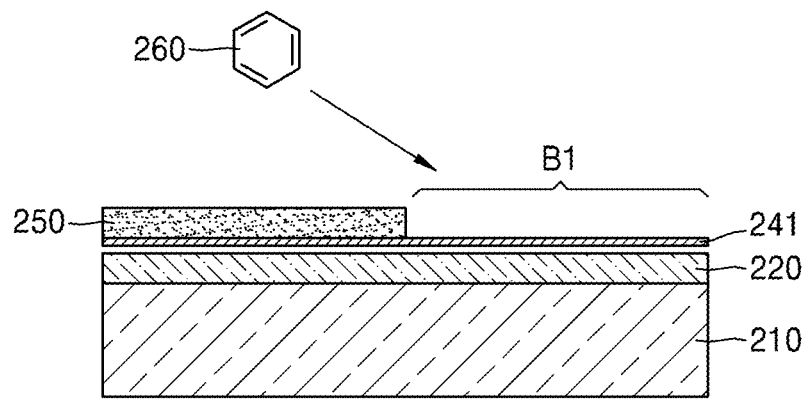

Next, referring to FIG. 4C, a first mask layer 250 may be formed so as to open a first area B1 of the first graphene 241 and cover the remaining area thereof. This may be similar to the structure of FIG. 1C in which the underlayer 120 and the first mask layer 150 are formed on the substrate 110. The first mask layer 250 may be formed from metal, a metal compound, oxide, nitride, or like, or may be formed from a polymer. Next, a first multilayer graphene forming process may be conducted at a second temperature T21 by using a second source gas 260.

Figure 4D:
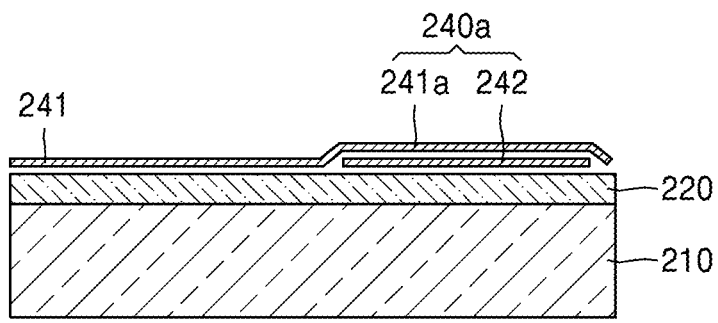

As a result of the first multilayer graphene forming process of FIG. 4C, as shown in FIG. 4D, the area of the first graphene 241 not covered with the first mask layer 250, namely, the first area B1, may become a first multilayer graphene 240a. In other words, the material of the second source gas 260 may be adsorbed to the underlayer 220 via the exposed first area B1 of the first graphene 241 to thereby form a second graphene 242 (see FIG. 4D). Accordingly, the first multilayer graphene 240a may be formed in the first area B1. The second graphene 242 formed in the first area B1 may also be a monolayer graphene. In this case, the first multilayer graphene 240a may be a bilayer graphene. Alternatively, the second graphene 242 may be grown as a bilayer or a multilayer of three or more layers. In this case, the first multilayer graphene 240a may be a multilayer graphene including three or more layers.

Figure 4E:
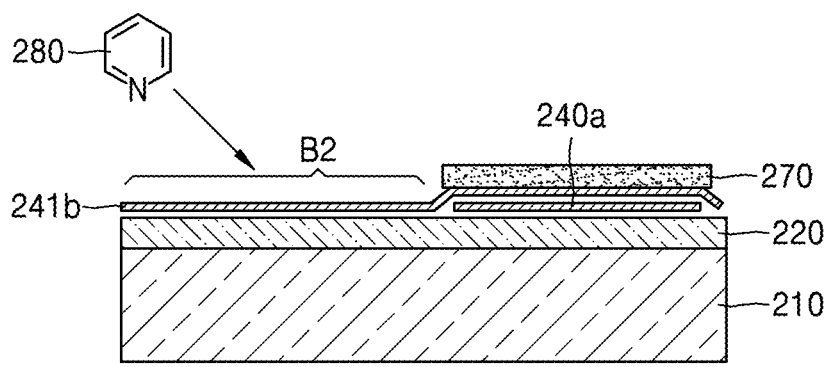

Referring to FIGS. 4D and 4E, after the first mask layer 250 of FIG. 4C is removed, a second mask layer 270 may be formed on the first multilayer graphene 240a. The second mask layer 270 may be formed from metal, a metal compound, oxide, nitride, or like, or may be formed from a polymer. The second mask layer 270 exposes a second area B2 of the first graphene 241, the second area B2 including no first multilayer graphenes 240a. A second multilayer graphene forming process may be conducted on the second area B2 at a third temperature T31 by using a third source gas 280. Consequently, the material of the third source gas 280 is adsorbed to the underlayer 220 via a first graphene 241b of the second area B2 to thereby form a third graphene 243 (see FIG. 4F). The third graphene 243 formed in the second area B2 may also be a monolayer graphene. In this case, a second multilayer graphene 240b (see FIG. 4F) may be a bilayer graphene. Alternatively, the third graphene 243 may be grown as a bilayer or a multilayer of three or more layers. In this case, the second multilayer graphene 240b may be a multilayer graphene including three or more layers.

Figure 4F:
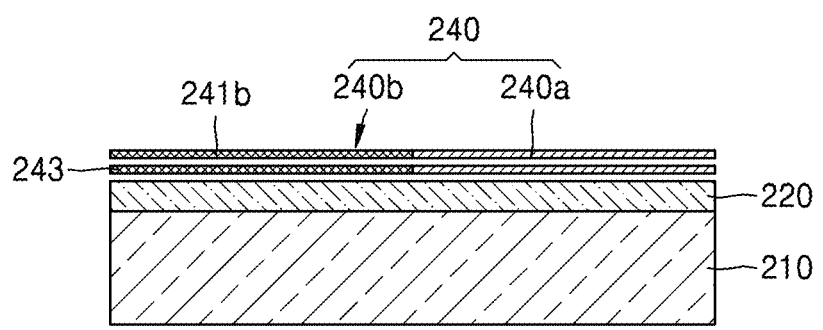

Consequently, as shown in FIG. 4F, the second graphene bilayer 240b joined with the first graphene bilayer 240a may be formed in the second area B2. The third graphene 243 formed in the second area B2 may also be a monolayer graphene. In this case, the second multilayer graphene 240b may be a bilayer graphene. The first multilayer graphene 240a and the second multilayer graphene 240b may constitute a multilayer graphene 240. As described above, the first multilayer graphene 240a and the second multilayer graphene 240b may be bilayers. In this case, the multilayer graphene 240 may be a bilayer graphene.

According to the present exemplary embodiment, the second source gas 260 of FIG. 4C may be different from the third source gas 280 of FIG. 4E. For example, the second source gas 260 may include a first hydrocarbon compound, and the third source gas 280 may include a second hydrocarbon compound. The first hydrocarbon compound may not contain N, and the second hydrocarbon compound may contain N. For example, the second source gas 260 may include a hydrocarbon compound, such as benzene ($C_6H_6$), ethylene ($C_2H_4$), or acetylene ($C_2H_2$). The hydrocarbon compound may be composed of only C and H. The second source gas 260 may include a boron (B)-containing hydrocarbon compound, for example, triethylborane ($C_6H_{15}B$). Accordingly, the second source gas 260 may include at least one of the hydrocarbon compounds including benzene ($C_6H_6$), ethylene ($C_2H_4$), acetylene ($C_2H_2$), and triethylborane ($C_6H_{15}B$). The third source gas 280 may include a N-containing hydrocarbon compound, for example, pyridine ($C_6H_5N$). As such, when the second source gas 260 and the third source gas 280 are different, the second temperature T21 and the third temperature T31 may be different from each other or may be the same as each other. The second temperature T21 may be higher than the third temperature T31, or vice versa. In some cases, the two temperatures T21 and T31 may be equal to each other or may be similar to each other.

In FIG. 4C, when the second source gas 260 includes benzene ($C_6H_6$), ethylene ($C_2H_4$), or acetylene ($C_2H_2$), the second temperature T21 may be about 450° C. to about 1200° C. When the second source gas 260 includes triethylborane ($C_6H_{15}B$), the second temperature T21 may be about 320° C. to about 630° C. Under this condition, the first multilayer graphene 240a of FIG. 4D may have a p-type conductivity. Accordingly, the second temperature T21 may have a wide range of about 320° C. to about 1200° C. When the second source gas 260 includes a hydrocarbon compound such as benzene ($C_6H_6$), ethylene ($C_2H_4$), or acetylene ($C_2H_2$), the first multilayer graphene 240a may be composed of only C atoms and may have p-type semiconductor characteristics due to the underlayer 220. When the second source gas 260 includes a hydrocarbon compound such as triethylborane ($C_6H_{15}B$), the first multilayer graphene 240a may include B atoms and may have p-type semiconductor characteristics due to the B atoms. B may serve as a p-type dopant for graphene. As described above, the first multilayer graphene 240a may be a bilayer. In this case, the first multilayer graphene 240a may be p-type bilayer graphene having bandgap opening.

The first source gas 230 of FIG. 4A may be the same as or different from the second source gas 260 of FIG. 4C. For example, the first source gas 230 of FIG. 4A may be the same as the second source gas 260 of FIG. 4C, and the first temperature T11 may be equal to the second temperature T21. As another example, the first source gas 230 and the first temperature T11 of FIG. 4A may be the same as the first source gas 130 and the first temperature T10 of FIG. 1A.

In FIG. 4D, when the third source gas 280 includes pyridine ($C_5H_5N$), the third temperature T31 may be about 550° C. or less. In this case, the formed second multilayer graphene 240b of FIG. 4F may be an n-type multilayer graphene including N atoms, which is the same as presented above with respect to the second multilayer graphene 140b with reference to FIGS. 1E and 1F. The third temperature T31 may be in a range of about 450° C. to about 550° C. As described above, the second multilayer graphene 240b may be a bilayer. In this case, the second multilayer graphene 240b may be an n-type bilayer graphene having bandgap opening.

Consequently, the bandgap of the multilayer graphene 240 formed according to the present exemplary embodiment is open, and the multilayer graphene 240 may be a pn-junctioned bilayer graphene. By appropriately selecting the number of layers included in the first graphene 241 and the number of layers included in each of the second and the third graphenes 242 and 243 according to desired characteristics, the multilayer graphene 240 may be a multilayer graphene including three or more layers.

According to the exemplary embodiment of FIGS. 4A-4F, the first multilayer graphene 240a may be a p-type and the second multilayer graphene 240b may be an n-type. According to another exemplary embodiment, an n-type multilayer graphene may be formed first, and a p-type multilayer graphene may then be formed. For example, by reversing the first multilayer graphene forming process of FIG. 4C and the second multilayer graphene forming process of FIG. 4E, the n-type multilayer graphene may be first formed, and the p-type multilayer graphene may then be formed. In this case, to prevent damage to the n-type multilayer graphene during formation of the p-type multilayer graphene, the temperature for forming the p-type multilayer graphene may be less than or equal to the temperature for forming the n-type multilayer graphene.

FIGS. 5A-5H are cross-sectional views illustrating a method of manufacturing a multilayer graphene, according to another exemplary embodiment.

Figure 5A:
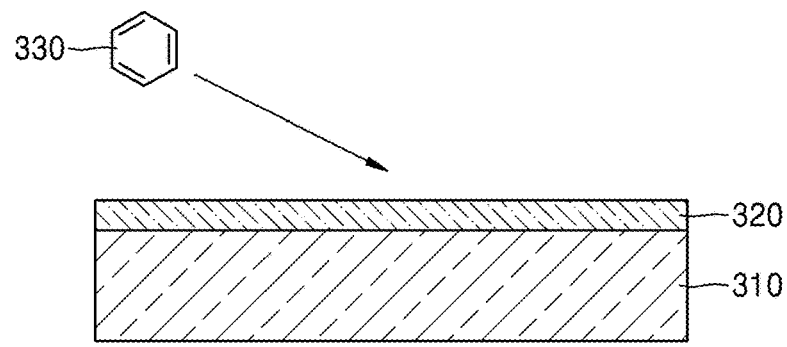
FIGS. 5A-5H are cross-sectional views illustrating a method of manufacturing a multilayer graphene, according to another exemplary embodiment.

Referring to FIG. 5A, a substrate 310 on which an underlayer 320 is formed is prepared. The substrate 310 and the underlayer 320 may be the same as or similar to the substrate 110 and the underlayer 120 of FIG. 1A or the substrate 210 and the underlayer 220 of FIG. 4A.

Figure 5B:
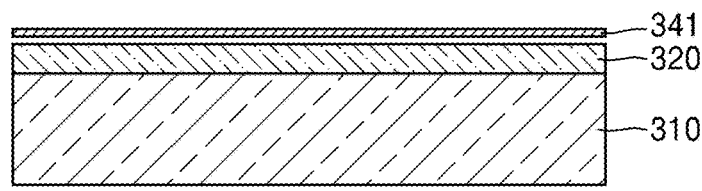

As shown in FIG. 5B, a first graphene 341 is formed on the underlayer 320 by using a first source gas 330 at a first temperature T13. The process of FIGS. 5A and 5B may be the same as or similar to the first graphene forming process of FIGS. 1A and 1B or FIGS. 4A and 4B.

Figure 5C:
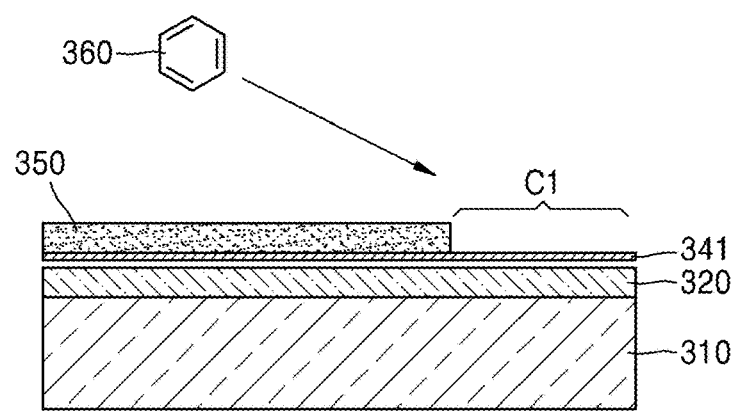

Next, referring to FIG. 5C, a first mask layer 350 may be formed so as to open a first area C1 of the first graphene 341 and so as to cover the remaining area thereof. This may be similar to the structure of FIG. 1C in which the underlayer 120 and the first mask layer 150 are formed on the substrate 110. The first mask layer 350 may be formed from metal, a metal compound, oxide, nitride, or like, or may be formed from a polymer. Next, a first multilayer graphene forming process may be conducted on the first area C1 at a second temperature T23 by using a second source gas 360.

The second source gas 360 and the second temperature T23 may correspond to the first source gas 130 and the first temperature T10 of FIG. 1C, respectively, or may correspond to the second source gas 260 and the second temperature T21 of FIG. 3C, respectively.

Figure 5D:
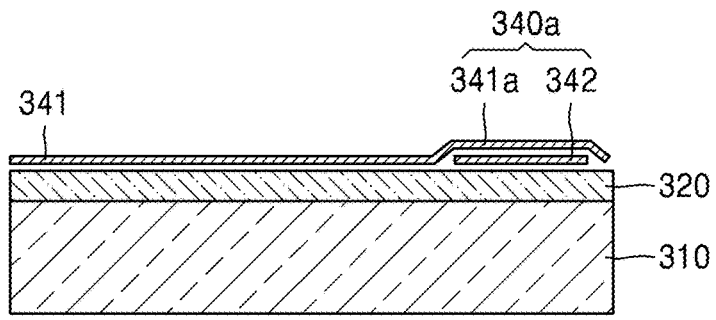

As a result of the first multilayer graphene forming process of FIG. 5C, as shown in FIG. 5D, a first multilayer graphene 340a including a first graphene 341a of the first area C1 and a second graphene 342 may be formed. The first multilayer graphene 340a may be, for example, a p-type bilayer graphene including a bandgap opening.

Figure 5E:
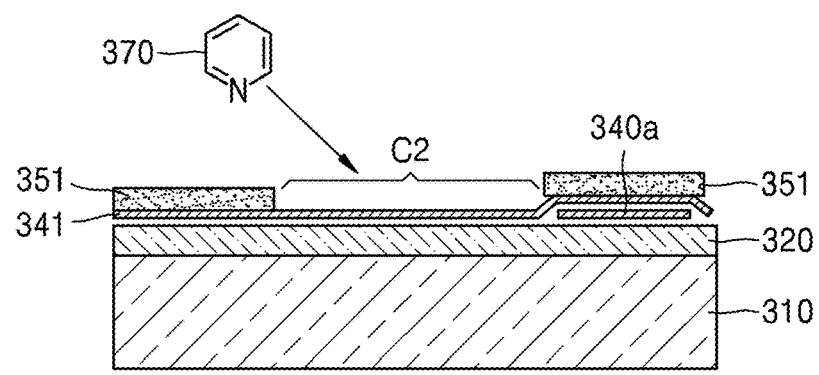

Referring to FIG. 5E, after the first mask layer 350 of FIG. 5C is removed, a second mask layer 351 may be formed. A second area C2 of the first graphene 341 may not be covered by the second mask layer 351 and may be exposed. Next, a second multilayer graphene forming process may be conducted on the second area C2 at a third temperature T33 by using a third source gas 370. The third source gas 370 and the third temperature T33 may correspond to the second source gas 160 and the second temperature T20 of FIG. 1E, respectively, or may correspond to the third source gas 280 and the third temperature T31 of FIG. 2E, respectively.

Figure 5F:
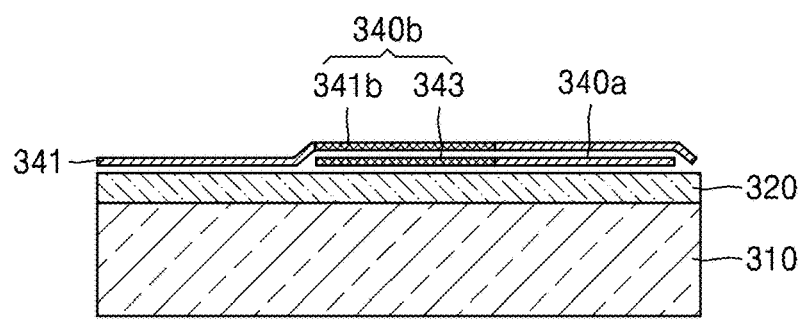

As a result of the second multilayer graphene forming process of FIG. 5E, as shown in FIG. 5F, a second multilayer graphene 340b including a first graphene 341b of the second area C2 and a third graphene 343 may be formed. The second multilayer graphene 340b may be, for example, an n-type bilayer graphene including a bandgap opening.

Figure 5G:
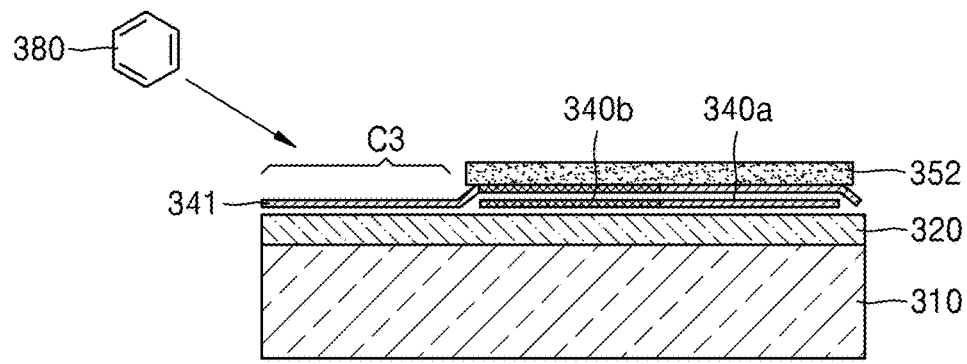

Referring to FIG. 5G, after the second mask layer 351 of FIG. 5E is removed, a third mask layer 352 may be formed. A third area C3 of the first graphene 341 may not be covered with the third mask layer 352 and may be exposed. Next, a third multilayer graphene forming process may be conducted on the exposed third area C3 of the first graphene 341. At this time, a fourth source gas 380 and a fourth temperature T43 may be used. The fourth source gas 380 may include a boron (B)-containing hydrocarbon compound, for example, triethylborane ($C_6H_{15}B$), or include a hydrocarbon compound, such as benzene (C6H6), ethylene ($C_2H_4$), or acetylene ($C_2H_2$). When the second multilayer graphene 340b formed by the third source gas 370 is an n-type and a third multilayer graphene 340c of FIG. 5H formed by the fourth source gas 380 is a p-type, the fourth temperature T43 for forming the third multilayer graphene 340c may be less than or equal to the third temperature T33 for forming the second multilayer graphene 340b. This may be to prevent damage to the second multilayer graphene 340b during formation of the third multilayer graphene 340c. For example, the fourth temperature T43 may be less than about 550° C. or less than about 500° C.

Figure 5H:
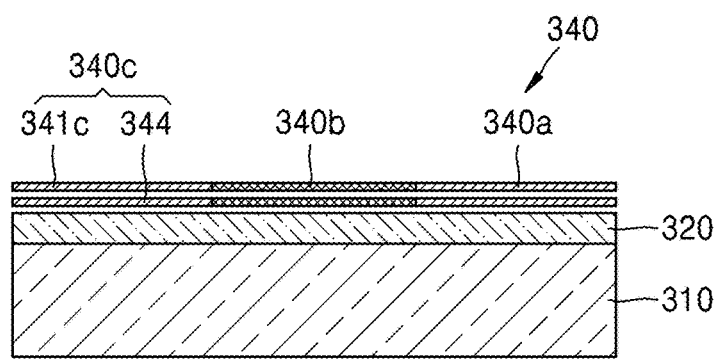

As a result of the third multilayer graphene forming process of FIG. 5G, as shown in FIG. 5H, a third multilayer graphene 340c including a first graphene 341c of the third area C3 and a fourth graphene 344 may be formed. The third multilayer graphene 340c may be, for example, a p-type bilayer graphene including a bandgap opening.

In FIG. 5H, the first through third multilayer graphenes 340a, 340b, and 340c may constitute a multilayer graphene 340. The multilayer graphene 340 may be considered to have a pnp junction structure. As described above, the first through third multilayer graphenes 340a, 340b, and 340c may be bilayers. In this case, the multilayer graphene 340 may have a bandgap. Sizes and shapes of the first through third multilayer graphenes 340a, 340b, and 340c may vary. By appropriately selecting the number of layers included in the first graphene 341 of FIG. 5B and the number of layers included in each of the second, the third, and the fourth graphenes 342, 343, and 344 of FIGS. 5D, 5F, and 5H according to desired characteristics, the multilayer graphene 340 may be a multilayer graphene including three or more layers.

Although FIGS. 5A-5H illustrate and describe a method of forming the multilayer graphene 340 having a pnp structure, it will be understood by one of ordinary skill in the art that a multilayer graphene having an npn structure may also be formed.

FIGS. 6A-6D are cross-sectional views illustrating a method of manufacturing a multilayer graphene, according to another exemplary embodiment.

Figure 6A:
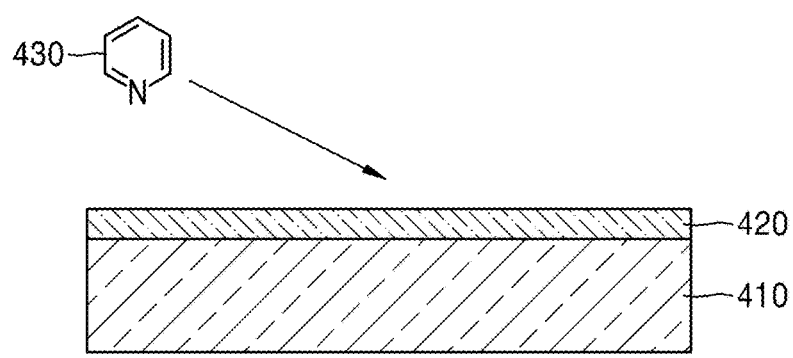
FIGS. 6A-6D are cross-sectional views illustrating a method of manufacturing a multilayer graphene, according to another exemplary embodiment.

Referring to FIG. 6A, a substrate 410 on which an underlayer 420 is formed is prepared. The substrate 410 and the underlayer 420 may be the same as or similar to the substrate 110 and the underlayer 120 of FIG. 1A or the substrate 210 and the underlayer 220 of FIG. 4A.

Figure 6B:
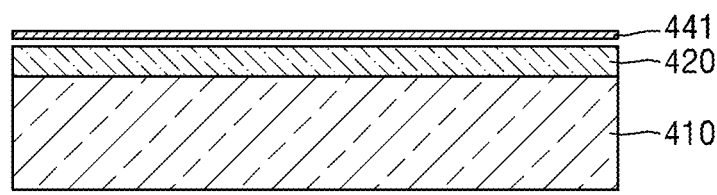

As shown in FIG. 6B, a first graphene 441 is formed on the underlayer 420 by using a first source gas 430 at a first temperature T14. The process of FIGS. 6A and 6B may be the same as or similar to the first graphene forming process of FIGS. 1A and 1B or FIGS. 4A and 4B. The first graphene 441 may be formed as a monolayer by, for example, adjusting the duration of the heating process. The first graphene 441 may also be grown as a bilayer or a multilayer of three or more layers by, for example, extending the duration of the heating process.

Figure 6C:
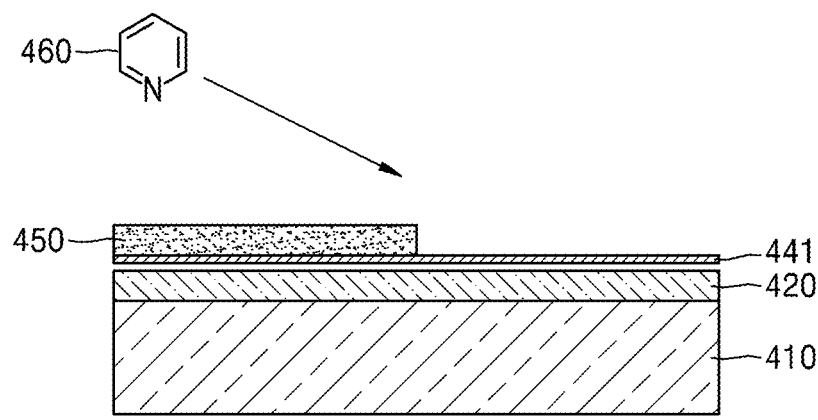

Next, referring to FIG. 6C, a mask layer 450 may be formed so as to cover a portion of the first graphene 441. The mask layer 450 may be formed from metal, a metal compound, oxide, nitride, or like, or may be formed from a polymer. Next, a multilayer graphene forming process may be conducted at a second temperature T24 by using a second source gas 460. The multilayer graphene forming process of FIG. 6C may be the same as the first multilayer graphene forming process of FIG. 1C or the second multilayer graphene forming process of FIG. 1E. The multilayer graphene forming process of FIG. 6C may be the same as the first multilayer graphene forming process of FIG. 4C or the second multilayer graphene forming process of FIG. 4E.

Figure 6D:
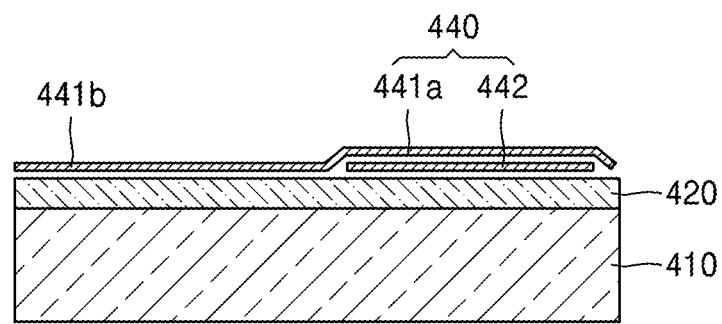

As a result of the multilayer graphene forming process of FIG. 6C, as shown in FIG. 6D, the area of the first graphene 441 not covered with the mask layer 450 may become a multilayer graphene 440. In other words, the material of the second source gas 460 may be adsorbed to the underlayer 420 via an exposed first graphene 441a to thereby form a second graphene 442. Accordingly, the multilayer graphene 440 may be formed in the area not covered with the mask layer 450. Similar to the above description, the multilayer graphene 440 may be, for example, a p-type bilayer graphene including bandgap opening or an n-type bilayer graphene including a bandgap opening. When the first graphene 441 or the second graphene 442 is a bilayer or a multilayer of three or more layers, the multilayer graphene 440 may be a multilayer graphene including three or more layers.

The first graphene 441b that remains without the multilayer graphene 440 being formed thereon in FIG. 6D may have a p-type or n-type conductivity due to a doping effect of the underlayer 420. For example, when the underlayer 420 includes Pt or Au and the first graphene 441 is formed as a monolayer as described above, the remaining first graphene 441b may have a closed bandgap and have an energy band structure in which Dirac points have simply moved upward from the Fermi level, namely, the p-type conductivity.

Thus, the remaining first graphene 441b and the multilayer graphene 440 may form a pn junction or a pp junction, and may form a junction of a zero-bandgap structure and a non-zero bandgap structure. By appropriately selecting the number of layers included in the first graphene 441 and the number of layers included in the second graphene 442 according to desired characteristics, the multilayer graphene 440 may possess a junction structure between multilayer graphenes including different layers.

FIGS. 7A-7D are cross-sectional views illustrating a method of manufacturing a multilayer graphene, according to another exemplary embodiment. FIG. 8 is a plan view of a multilayer graphene randomly formed according to the method according to the exemplary embodiment of FIGS. 7A-7D.

Figure 7A:
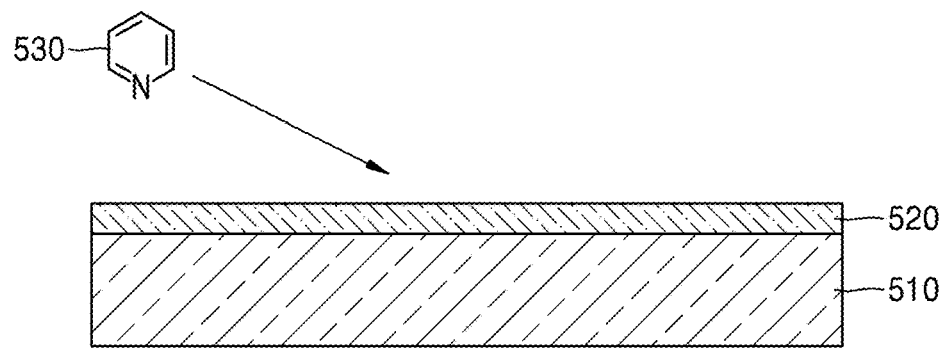
FIGS. 7A-7D are cross-sectional views illustrating a method of manufacturing a multilayer graphene, according to another exemplary embodiment.
Figure 8:
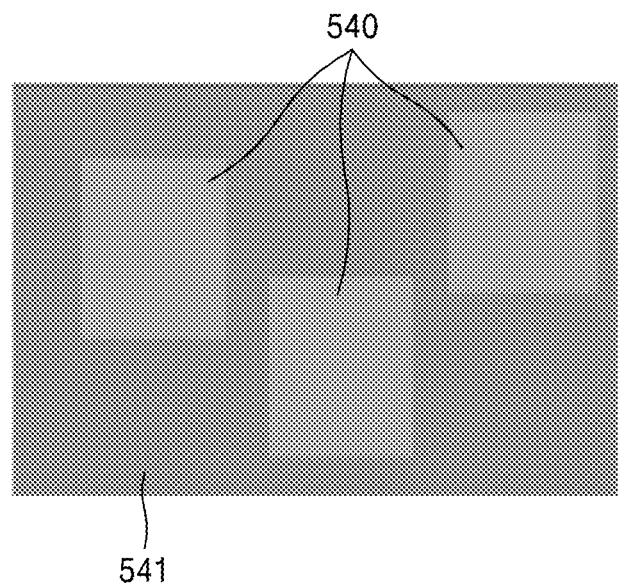
FIG. 8 is a plan view of a multilayer graphene randomly formed according to the method according to the exemplary embodiment of FIGS. 7A-7D.

Referring to FIG. 7A, a substrate 510 on which an underlayer 520 is formed is prepared. The substrate 510 and the underlayer 520 may be the same as or similar to the substrate 110 and the underlayer 120 of FIG. 1A or the substrate 210 and the underlayer 220 of FIG. 4A.

Figure 7B:
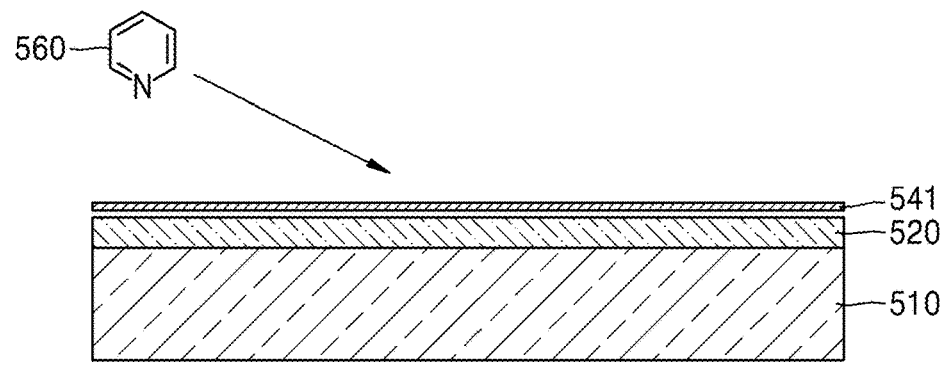

A first graphene 541 of FIG. 7B is formed on the underlayer 520 by using a first source gas 530 at a first temperature T15. The process of FIG. 7A may be the same as or similar to the first graphene forming process of FIGS. 1A and 1B or FIGS. 4A and 4B. The first graphene 541 may be formed as a monolayer by, for example, adjusting the duration of the heating process. The first graphene 541 may also be grown as a bilayer or a multilayer of three or more layers by, for example, extending the duration of the heating process.

Figure 7C:
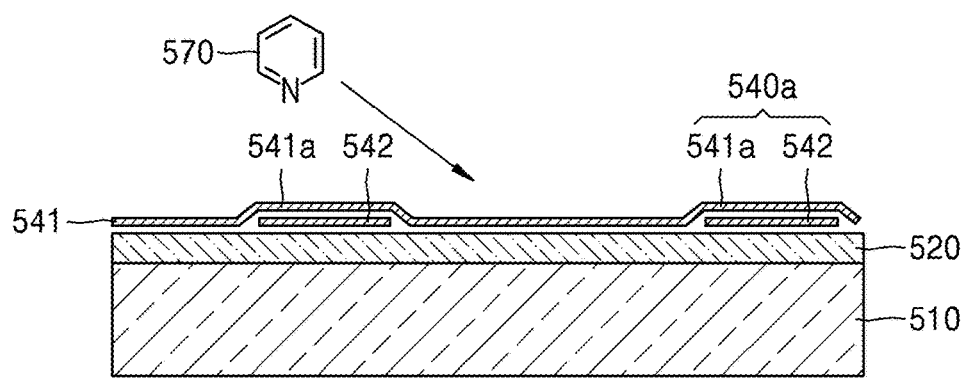

Next, as shown in FIG. 7B, a process of forming a first multilayer graphene 540a of FIG. 7C may be conducted at a second temperature T25 by using a second source gas 560. The process of FIG. 7B of forming the first multilayer graphene 540a may be conducted without any masks, and the size of the first multilayer graphene 540a may be controlled by adjusting the duration of the process. Since no masks are used, the material of the second source gas 560 may be adsorbed to a random area on the first graphene 541 to thereby form additionally second graphenes 542 (see FIG. 7C). Accordingly, a first multilayer graphene 540a (see FIG. 7C) may be randomly and irregularly formed on the underlayer 520. Since the process of forming the first multilayer graphene 540a is stopped before the second graphene 542 expands on the entire area of the underlayer 520, the second graphene 542 may be a monolayer graphene. The second graphene 542 and a first graphene 541a located thereon constitutes the first multilayer graphene 540a. The process of forming the first multilayer graphene 540a may be similar to the first multilayer graphene forming process of FIG. 1C or the first multilayer graphene forming process of FIG. 4C except that no masks are used.

Figure 7D:
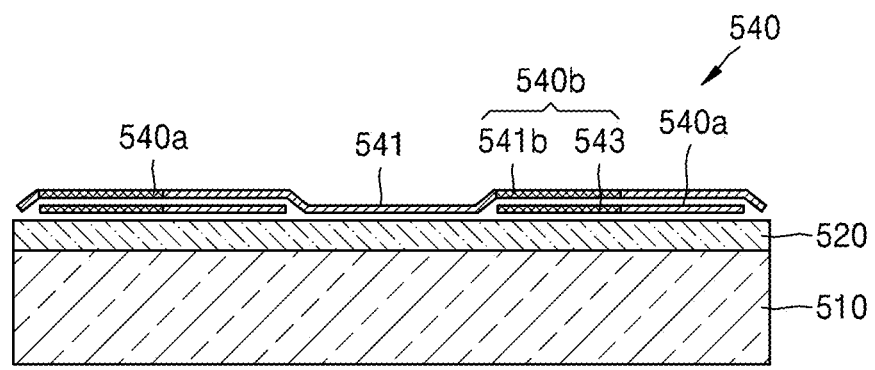

Next, as shown in FIG. 7C, a process of forming a second multilayer graphene 540b of FIG. 7D may be conducted at a third temperature T35 by using a third source gas 570. The process of FIG. 7C of forming the second multilayer graphene 540b may be conducted without any masks, and the size of the second multilayer graphene 540b may be controlled by adjusting the duration of the process. When the first multilayer graphene 540a is formed and in this state a third graphene 543 is formed using the third source gas 570 and the third temperature T35, C atoms move toward the most energetically stable place. Thus, the third graphene 543 may grow from a lateral surface of the second graphene 542. The third graphene 543 and a first graphene 541b located thereon constitutes the second multilayer graphene 540b. Since the process of forming the second multilayer graphene 540b is stopped before the third graphene 543 invades the area of the second graphene 542, the third graphene 543 may be a monolayer graphene.

Consequently, as shown in FIG. 7D, the first multilayer graphene 540a and the second multilayer graphene 540b are joined together at an arbitrary interface and constitute a multilayer graphene 540. When the first graphene 541 is a monolayer, the multilayer graphene 540 may be a bilayer.

As shown in FIG. 8, multilayer graphenes 540 may be randomly distributed on the underlayer 520, and the first graphene 541 may remain on some areas of the underlayer 520. By appropriately adjusting the durations for forming the first and second multilayer graphenes 540a and 540b, the first and second multilayer graphenes 540a and 540b may be randomly distributed over the entire surface of the underlayer 520 and may be densely formed.

Various devices including multilayer graphenes such as the multilayer graphene 540 having the above random structure, either on the same substrate or having been transferred to another substrate may be manufactured.

FIGS. 9A-9F are cross-sectional views illustrating a method of manufacturing a multilayer graphene, according to another exemplary embodiment.

Figure 9A:
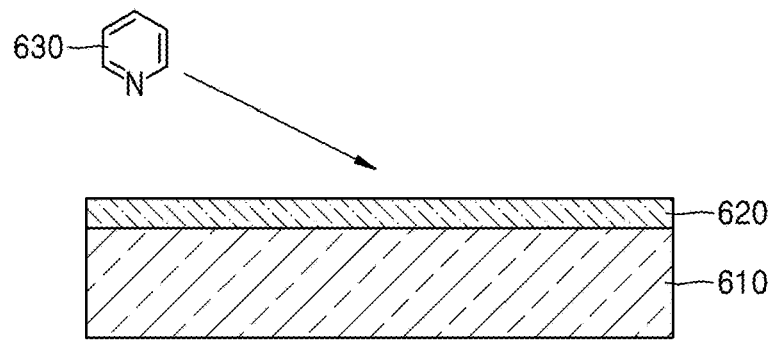
FIGS. 9A-9F are cross-sectional views illustrating a method of manufacturing a multilayer graphene, according to another exemplary embodiment.

Referring to FIG. 9A, a substrate 610 on which an underlayer 620 is formed is prepared. The substrate 610 and the underlayer 620 may be the same as or similar to the substrate 110 and the underlayer 120 of FIG. 1A or the substrate 210 and the underlayer 220 of FIG. 4A.

Figure 9B:
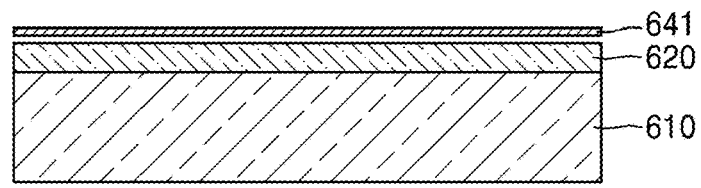

As shown in FIG. 9B, a first graphene 641 is formed on the underlayer 620 by using a first source gas 630 at a first temperature T16. The process of FIGS. 9A and 9B may be the same as or similar to the first graphene forming process of FIGS. 1A and 1B or FIGS. 4A and 4B. The first graphene 641 may be formed as a monolayer by, for example, adjusting the duration of the heating process. The first graphene 641 may also be grown as a bilayer or a multilayer of three or more layers by, for example, extending the duration of the heating process.

Figure 9C:
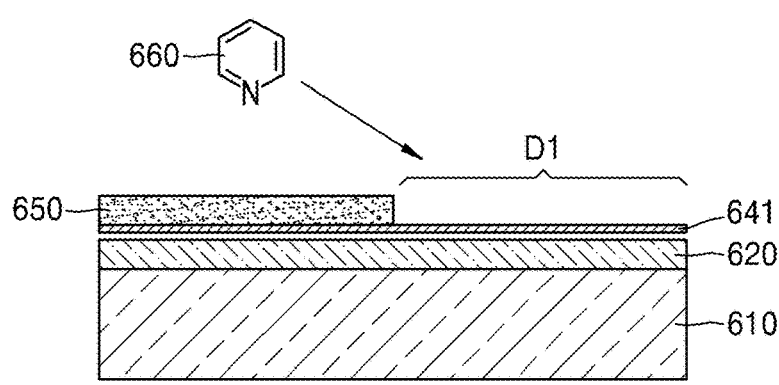

Next, referring to FIG. 9C, a first mask layer 650 may be formed so as to open a first area D1 of the first graphene 641 and so as cover the remaining area thereof. This may be similar to the structure of FIG. 1C in which the underlayer 120 and the first mask layer 150 are formed on the substrate 110. The first mask layer 650 may be formed from metal, a metal compound, oxide, nitride, or like, or may be formed from a polymer. Next, a first multilayer graphene forming process may be conducted at a second temperature T26 by using a second source gas 660.

Figure 9D:
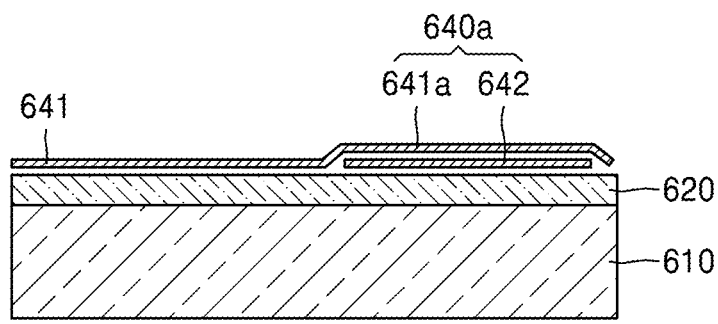

As a result of the first multilayer graphene forming process of FIG. 9C, as shown in FIG. 9D, an area of the first graphene 641 not covered with the first mask layer 650, namely, the first area D1, may become a first multilayer graphene 640a. In other words, the material of the second source gas 660 may be adsorbed to the underlayer 620 via the exposed first area D1 of the first graphene 641 to thereby form a second graphene 642 (see FIG. 6D). Accordingly, the first multilayer graphene 640a may be formed in the first area D1.

Figure 9E:
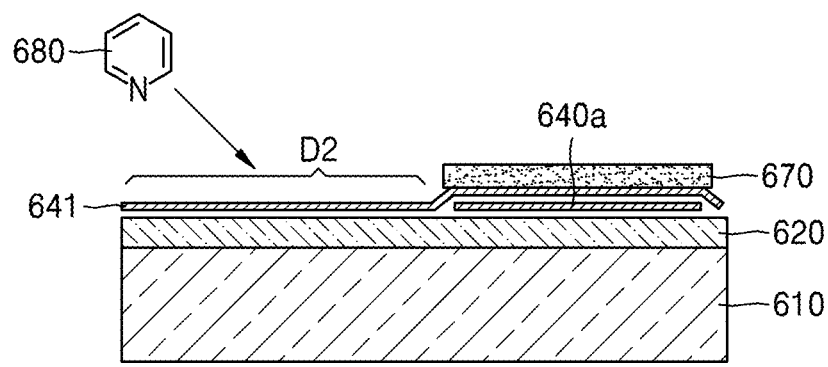

Referring to FIGS. 9D and 9E, after the first mask layer 650 of FIG. 9C is removed, a second mask layer 670 may be formed on the first multilayer graphene 640a. The second mask layer 670 may be formed from metal, a metal compound, oxide, nitride, or like, or may be formed from a polymer. The second mask layer 670 exposes a second area D2 of the first graphene 641, the second area D2 including no first multilayer graphene 640a. A second multilayer graphene forming process may be conducted on the second area D2 at a third temperature T36 by using a third source gas 680.

Figure 9F:
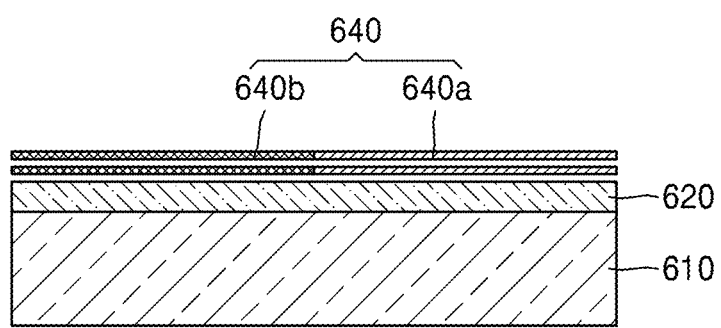

As a result of the second multilayer graphene forming process of FIG. 9E, as shown in FIG. 9F, a second multilayer graphene 640b joined with the first multilayer graphene 640a may be formed. The first multilayer graphene 640a and the second multilayer graphene 640b may constitute a multilayer graphene 640.

According to the present exemplary embodiment, the first multilayer graphene 640a and the second multilayer graphene 640b may have the same type of conductivity and different doping concentrations. The first multilayer graphene 640a may be, for example, an n-type bilayer graphene having an open bandgap, and the second multilayer graphene 640b may be, for example, an n+-type bilayer graphene having an open bandgap. Alternatively, the first multilayer graphene 640a may be, for example, an n+-type bilayer graphene having an open bandgap, and the second multilayer graphene 640b may be, for example, an n-type bilayer graphene having an open bandgap. As another example, the first multilayer graphene 640a may be, for example, a p-type bilayer graphene having an open bandgap, and the second multilayer graphene 640b may be, for example, a p+-type bilayer graphene having an open bandgap. Alternatively, the first multilayer graphene 640a may be, for example, a p+-type bilayer graphene having an open bandgap, and the second multilayer graphene 640b may be, for example, a p-type bilayer graphene having an open bandgap.

For example, the second source gas 660 and the third source gas 680 may include a N-containing hydrocarbon compound, for example, pyridine ($C_5H_5N$). When forming the first multilayer graphene 640a, the second temperature T26 may be set below 800° C. (for example, 550° C. to 800° C.) so that some amount of N remains in the first multilayer graphene 640a. When forming the second multilayer graphene 640b, the third temperature T36 may be set to be 550° C. or less so that a higher amount of N remains in the second multilayer graphene 640b than in the first multilayer graphene 640a. In other words, by setting a doping concentration of the second multilayer graphene 640b to be higher than that of the first multilayer graphene 640a, a multilayer graphene 640 having a bandgap-open nn+ junction structure may be formed.

By appropriately selecting the number of layers included in the first graphene 641 of FIG. 9B and the number of layers included in the second graphene 642 of FIG. 9D according to desired characteristics, the multilayer graphene 640 may have a structure in which multilayer graphenes having the same type of conductivity and each including three or more layers are cemented together.

Figure 10A:
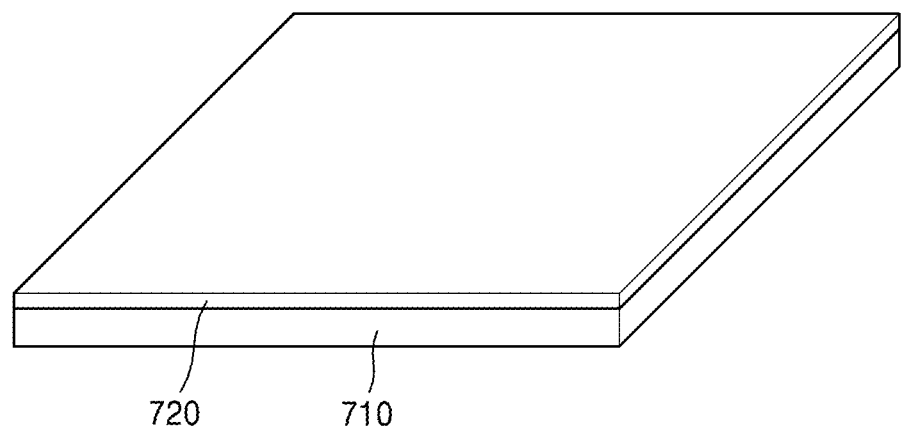
FIGS. 10A-10C are perspective views illustrating a method of manufacturing a multilayer graphene, according to another exemplary embodiment.
Figure 10B:
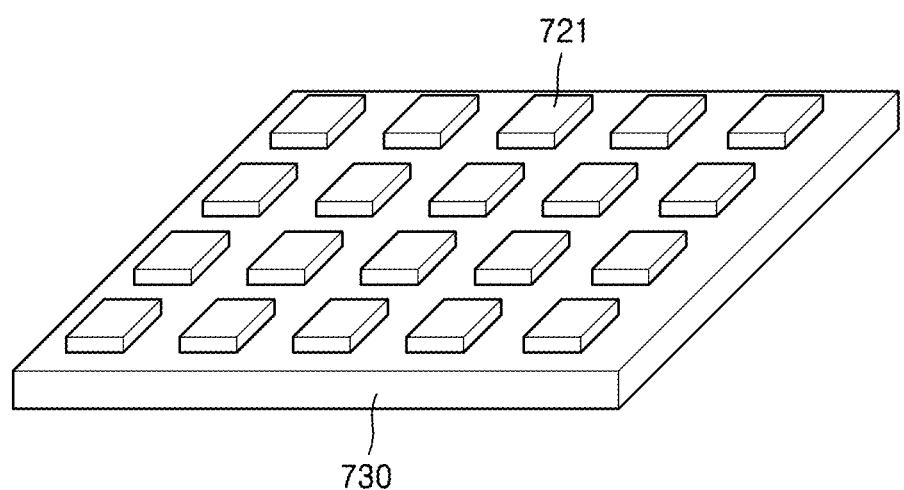
Figure 10C:
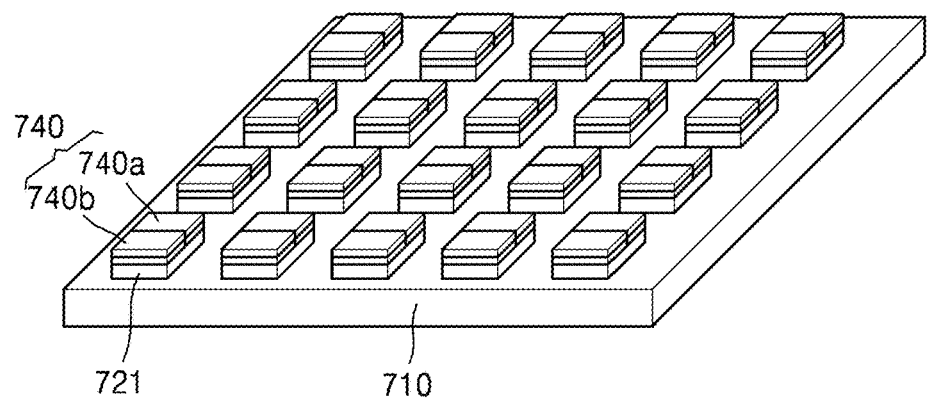

FIGS. 10A-10C are perspective views illustrating a method of manufacturing a multilayer graphene, according to another exemplary embodiment.

Referring to FIG. 10A, a first material layer 720 may be formed on a substrate 710. The substrate 710 may be formed from a material that is the same as or similar to that used to form the substrates 110, 210, 310, 410, 510, and 610 of FIGS. 1A-9F. The first material layer 720 may be formed from a material that is the same as or similar to that used to form the underlayers 120, 220, 320, 420, 520, and 620 of FIGS. 1A-9F. The first material layer 720 may be a catalyst material layer. The catalyst material layer may be a metal layer.

Referring to FIG. 10B, the first material layer 720 may be patterned to form a plurality of underlayers 721 spaced apart from one another. Each of the plurality of underlayer 721 may be the same as or similar to the underlayers 120, 220, 320, 420, 520, and 620 of FIGS. 1A-9F.

Referring to FIG. 10C, a multilayer graphene 740 may be formed on each of the plurality of underlayers 721. The multilayer graphene 740 may include a first multilayer graphene 740a and a second multilayer graphene 740b. The first multilayer graphene 740a and the second multilayer graphene 140b may be cemented together. For example, one of the first multilayer graphene 740a and the second multilayer graphene 740b may have a bandgap-open p-type conductivity, the other may have a bandgap-open n-type conductivity, and the multilayer graphene 740 may be a bilayer graphene having a bandgap-open pn junction structure. The method of forming the multilayer graphene 740 may be the same as or similar to the method of FIG. 1F of forming the multilayer graphene 140, the method of FIG. 4F of forming the multilayer graphene 240, the method of FIG. 6D of forming the multilayer graphene 440, the method of FIG. 7D of forming the multilayer graphene 540, and the method of FIG. 9D of forming the multilayer graphene 640. Although the multilayer graphene 740 has a pn structure in FIGS. 10A-10C, the multilayer graphene 740 may have a pnp structure or an npn structure. When the multilayer graphene 740 has a pnp or npn structure, the method of forming the multilayer graphene 740 may be the same as or similar to that described above with reference to FIGS. 5A-5H.

As shown in the method of FIGS. 10A-10C, when the plurality of underlayers 721 are formed by patterning the first material layer 720, and then the multilayer graphene 740 is formed on each of the plurality of underlayers 721, a plurality of multilayer graphenes 740 patterned in a desired shape may be easily manufactured.

If a single graphene sheet is formed on (or transferred onto) a substrate and then a plurality of multilayer graphenes spaced apart from one another are formed by patterning (etching) the single graphene sheet, an edge portion of each multilayer graphene may be damaged due to the patterning (etching). A portion of photoresist (PR) that is used during the patterning (etching) may remain in the multilayer graphenes, and thus the physical properties of the multilayer graphenes and the characteristics of a device including the multilayer graphenes may degrade. Controlling the shapes or sizes of the multilayer graphenes according to a method of directly patterning the graphene sheet may be difficult. However, according to an exemplary embodiment of the present disclosure, since the plurality of multilayer graphenes 740 are formed on the plurality of pre-patterned underlayers 721, damage to edge portions of the multilayer graphenes 740 may be prevented, and the problem of photoresist remaining behind may also be prevented. Moreover, since etching (patterning) the first material layer 720 may be easier than directly etching (patterning) a graphene sheet, when the first material layer 720 is etched (patterned) and then patterned multilayer graphenes 740 are formed on a resultant structure, it may be easy to control the size and shape of the multilayer graphenes 740.

Figure 11:
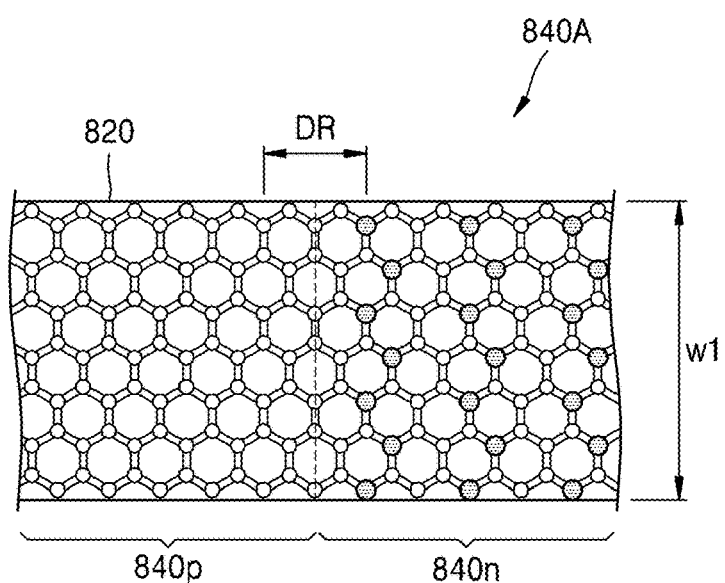
FIG. 11 is a plan view of a structure of a multilayer graphene according to an exemplary embodiment.

FIG. 11 is a plan view of a structure of a multilayer graphene 840A according to an exemplary embodiment.

Referring to FIG. 11, the multilayer graphene 840A may be formed on an underlayer 820. The multilayer graphene 840A may include a p-type multilayer graphene 840p and an n-type multilayer graphene 840n. The n-type multilayer graphene 840n may be joined to a lateral surface of the p-type multilayer graphene 840p. The p-type multilayer graphene 840p and the n-type multilayer graphene 840n may each have a structure in which a plurality of monolayer graphenes are stacked.

A plurality of monolayer graphenes that constitute the n-type multilayer graphene 840n have a hexagonal crystal structure comprised of C atoms. In the crystal structure, some of the C atoms are replaced with first atoms. The first atoms may be, for example, N atoms. N atoms may serve as an n-type dopant. According to the present exemplary embodiment, both N atoms and C atoms constitute a hexagonal crystal structure. However, atoms other than N atoms may be used. A plurality of monolayer graphenes that constitute the p-type multilayer graphene 840p may have a hexagonal crystal structure comprised of only C atoms. The p-type multilayer graphene 840p may have p-type semiconductor characteristics due to a doping effect of the underlayer 820 disposed below the p-type multilayer graphene 840p. The underlayer 820 may include Pt as a catalyst metal. However, the material used to form the underlayer 820 is not limited to Pt, and various modifications may be made thereto.

According to the present exemplary embodiment, a depletion region (DR) formed at a boundary between the p-type multilayer graphene 840p and the n-type multilayer graphene 840n may have an extremely small width, for example, about 5 nm or less. The width of the depletion region DR may be about 2 nm or less. According to the present exemplary embodiment, the n-type multilayer graphene 840n may have n-type semiconductor characteristics due to the replacement of C atoms with the first atoms (for example, N atoms). In this case, the first atoms (for example, N atoms) may be uniformly or relatively uniformly distributed within the n-type multilayer graphene 840n. The p-type multilayer graphene 840p may have p-type semiconductor characteristics due to a change (increase) in a bandgap due to the underlayer 820. In this case, the junction between the p-type multilayer graphene 840p and the n-type multilayer graphene 840n may have a size (width) on an atomic scale, and the depletion region DR having an extremely small width may be formed between the p-type multilayer graphene 840p and the n-type multilayer graphene 840n. As described above, the width of the depletion region DR may be about 5 nm or less or about 2 nm or less. An n-doping effect due to N atoms may disappear when further from locations of N atoms by about 2 nm or greater. Thus, the width of the depletion region DR may be about 2 nm or less. No or little defects may be generated at the boundary between the p-type multilayer graphene 840p and the n-type multilayer graphene 840n formed according to the methods as described above. As such, since the depletion region DR formed between the p-type graphene 840p and the n-type graphene 840n has a small width and no or little defects exist on the boundary therebetween, the multilayer graphene 840A may have good characteristics and physical properties.

Manufacturing a multilayer graphene having a narrow depletion region at a pn junction according to existing methods or methods according to comparative examples may be difficult. For example, when a p-type doped region and an n-type doped region are formed on a graphene sheet by making different organic material layers (molecular layers) in contact with the graphene sheet, it is difficult to control the boundary between the p-type doped region and the n-type doped region at a small scale, and thus the boundary may not be pronounced and the pn junction characteristics may degrade. The boundary between the p-type doped region and the n-type doped region may have a width of several tens of μm or greater, for example, about 100 μm. Thus, it is difficult to obtain good pn junction characteristics, and it is also difficult to manufacture a graphene device having a small size (width) that is 100 μm or less. These problems may equally (or similarly) occur even when a pn junction is formed by forming a metal oxide layer on a portion of a graphene sheet via deposition. However, according to an exemplary embodiment, since the boundary (depletion region) between the p-type multilayer graphene 840p and the n-type multilayer graphene 840n may be formed at an extremely small scale of several nm or less, good pn junction characteristics may be obtained, and a small graphene device may be easily manufactured.

Moreover, according to an exemplary embodiment, the entire edge portion of the multilayer graphene 840A may have a defect-free crystalline structure. For example, the entire edge portion of the multilayer graphene 840A may have a defect-free zigzag structure. Since the multilayer graphene 840A is formed on the patterned underlayer 820 instead of directly patterning (etching) a graphene sheet, the edge portion of the multilayer graphene 840A may have a defect-free crystal structure. Thus, the multilayer graphene 840A may provide good characteristics, and a graphene device including the multilayer graphene 840A may have good performance.

The width w1 of the multilayer graphene 840A may be several nm to several hundreds of nm. Width w1 denotes a width of the multilayer graphene 840A in a shorter-axis direction. The width w1 of the multilayer graphene 840A may be, for example, about 500 nm or less or about 100 nm or less. When the patterned underlayer 820 is formed and then the multilayer graphene 840A is formed thereon, a multilayer graphene 840A having a width w1 of about 500 nm or less or about 100 nm or less and a defect-free edge portion may be easily formed. Forming a multilayer graphene having a width of about 1 μm or less according to an existing method, for example, by directly etching (patterning) a graphene sheet may be difficult, and the multilayer graphene may have degraded characteristics due to defects of an edge portion thereof. Since PR that is used during the etching (patterning) remains on the multilayer graphene, the characteristics of the multilayer graphene may also be degraded. According to an exemplary embodiment, these problems may be prevented or addressed, and a multilayer graphene having good characteristics may be easily formed.

In addition, when a plurality of underlayers corresponding to a formed pattern are formed and then a plurality of multilayer graphenes are formed thereon (see FIG. 10C), the size and shape of each of the multilayer graphenes may be easily controlled, and the interval between two adjacent multilayer graphenes may also be easily controlled to several tens of nm or several nm. Thus, the methods and the structures according to the present disclosure are usefully applicable to a device using two adjacent multilayer graphenes (for example, a device of FIG. 15C which will be described later).

Figure 12:
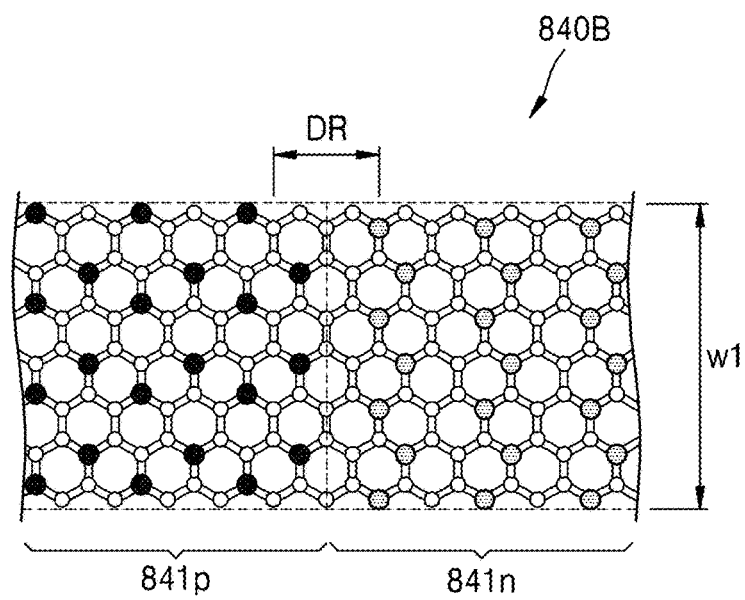
FIG. 12 is a plan view of a structure of a multilayer graphene according to another exemplary embodiment.

FIG. 12 is a plan view of a structure of a multilayer graphene 840B according to another exemplary embodiment.

Referring to FIG. 12, the multilayer graphene 840B may include a p-type multilayer graphene 841p and an n-type multilayer graphene 841n. The n-type multilayer graphene 841n may have substantially the same crystal structure as that of the n-type multilayer graphene 840n of FIG. 11. In other words, a plurality of monolayer graphenes that constitute the n-type multilayer graphene 841n have a hexagonal crystal structure comprised of C atoms. In the crystal structure, some of the C atoms may be replaced with first atoms. The first atoms may be, for example, N atoms. A plurality of monolayer graphenes that constitute the p-type multilayer graphene 841p have a hexagonal crystal structure comprised of C atoms. In the crystal structure, some of the C atoms may be replaced with second atoms that are different from the first atoms. The second atoms may be, for example, B atoms. B atoms may serve as a p-type dopant. An underlayer may be disposed below the p-type and n-type multilayer graphenes 841p and 841n. The underlayer may include a catalyst metal. The catalyst metal may include, for example, Pt, Cu, Ni, or Ir.

According to the present exemplary embodiment, a depletion region DR having a very small width may be formed at a boundary between the p-type multilayer graphene 841p and the n-type multilayer graphene 841n. The width of the depletion region DR may be, for example, about 5 nm or less or about 2 nm or less. Each of the p-type multilayer graphene 841p and the n-type multilayer graphene 841n may have good doping uniformity. The entire edge portion of the multilayer graphene 840B may have a defect-free crystalline structure, for example, a defect-free zigzag structure. The width w1 of the multilayer graphene 840B in a shorter-axis direction may be several nm to several hundreds of nm, for example, about 500 nm or less or about 100 nm or less.

The multilayer graphenes 840A or 840B of FIG. 11 or FIG. 12 may correspond to one of the multilayer graphenes of FIGS. 1A-9F. In other words, at least a portion of one of the multilayer graphenes of FIGS. 1A-9F may have the structure of the multilayer graphenes 840A or 840B of FIG. 11 or FIG. 12. For example, the first multilayer graphene 140a and the second multilayer graphene 140b of FIG. 1F may respectively correspond to the p-type multilayer graphene 840p and the n-type multilayer graphene 840n of FIG. 11. The first multilayer graphene 240a and the second multilayer graphene 240b may respectively correspond to the p-type graphene 840p and the n-type graphene 840n of FIG. 11 or may respectively correspond to the p-type multilayer graphene 841p and the n-type multilayer graphene 841n of FIG. 12.

For reference, the honeycomb unit structure that constitutes the hexagonal structure of each of the multilayer graphenes 840A and 840B of FIGS. 11 and 12 has a size that is arbitrarily determined for convenience, and the ratio between the actual length of the depletion region DR and the actual size of the honeycomb unit structure may be different from that shown in FIGS. 11 and 12. In other words, although the depletion region DR has a size corresponding to about two honeycomb unit structures in FIGS. 11 and 12, the actual size of the depletion region DR may be different from the size illustrated in FIGS. 11 and 12. In addition, the ratio between the size of the honeycomb unit structure and the width w1 of each of the multilayer graphenes 840A and 840B may be different from the actual ratio.

A method of manufacturing a device including a multilayer graphene (i.e., a graphene-containing device) according to an exemplary embodiment will now be described.

Figure 13A:
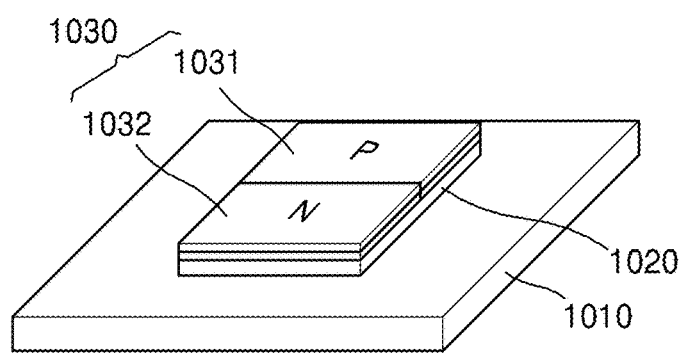
FIGS. 13A-13C are perspective views illustrating a method of manufacturing a graphene-containing device, according to an exemplary embodiment.
Figure 13B:
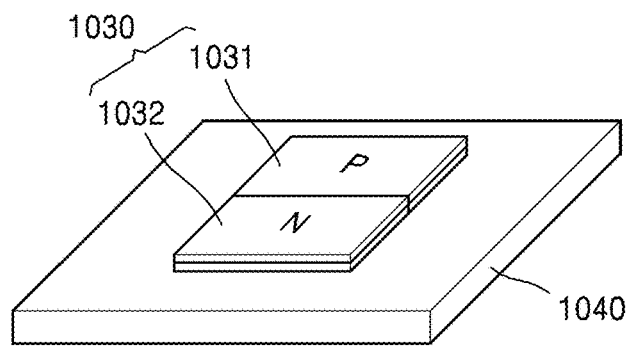
Figure 13C:
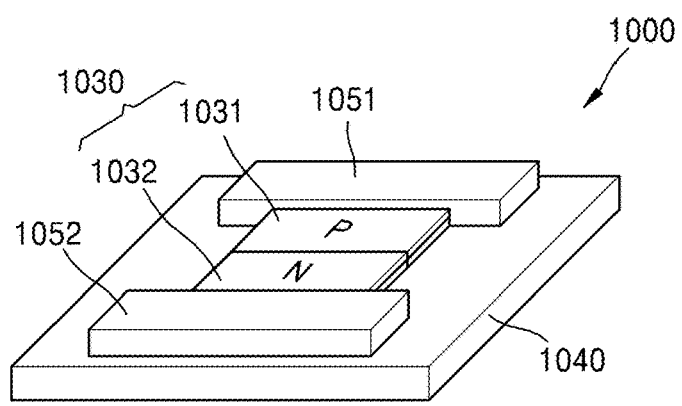

FIGS. 13A-13C are perspective views illustrating a method of manufacturing a graphene-containing device, according to an exemplary embodiment.

Referring to FIG. 13A, after an underlayer 1020 is formed on a first substrate 1010, a multilayer graphene 1030 having a pn junction structure may be formed on the underlayer 1020. The multilayer graphene 1030 may include a first multilayer graphene 1031 and a second multilayer graphene 1032. The first multilayer graphene 1031 may be a p-type multilayer graphene, and the second multilayer graphene 1032 may be an n-type multilayer graphene. The first and second multilayer graphenes 1031 and 1032 may be bilayer graphenes each having a bandgap. According to desired characteristics, the first and second multilayer graphenes 1031 and 1032 may be multilayer graphenes including three or more layers. The method of forming the multilayer graphene 1030 on the first substrate 1010 may be the same as or similar to the methods described with reference to FIGS. 1A-4F.

Referring to FIG. 13B, the multilayer graphene 1030 of the first substrate 1010 may be transferred to a second substrate 1040. The method of transferring the multilayer graphene 1030 from the first substrate 1010 to the second substrate 1040 may any well-known graphene transferring method. The second substrate 1040 may be a semiconductor substrate or an insulative substrate. The semiconductor substrate may be, for example, a silicon substrate. When a semiconductor substrate is used, an insulating layer may be formed on the semiconductor substrate, and then the multilayer graphene 1030 may be transferred onto the insulating layer. A conductive substrate may also be used as the second substrate 1040. In such a case, after an insulating layer is formed on the conductive substrate, the multilayer graphene 1030 may be transferred onto the insulating layer.

Referring to FIG. 13C, a device unit including the multilayer graphene 1030 may be formed on the second substrate 1040. For example, a first electrode 1051 may be connected to (contact) the first multilayer graphene 1031, and a second electrode 1052 may be connected to (contact) the second multilayer graphene 1032. Since the multilayer graphene 1030 has a pn junction structure, the multilayer graphene 1030 and the first and second electrodes 1051 and 1052 in contact with the multilayer graphene 1030 may constitute a diode device 1000. As described above, the multilayer graphene 1030 may be a bilayer graphene having a bandgap. In this case, the diode device 1000 may secure the characteristics of a pn-junction semiconductor device having a bandgap.

Figure 14A:
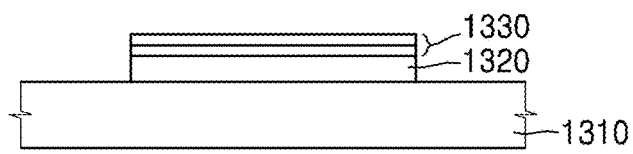
FIGS. 14A-14C are cross-sectional views illustrating a method of manufacturing a graphene-containing device, according to another exemplary embodiment.
Figure 14B:
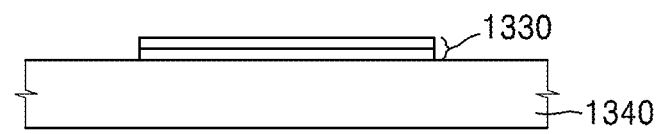
Figure 14C:
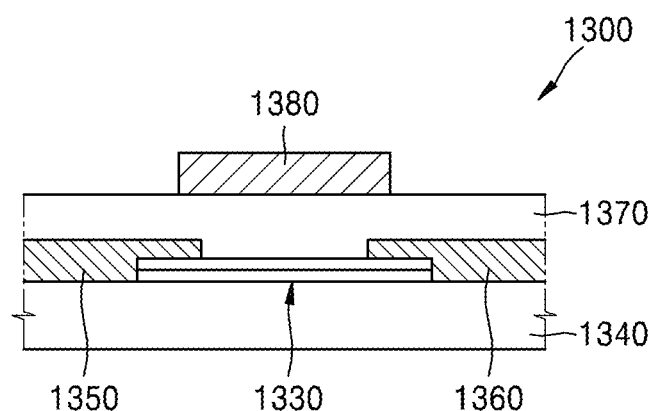

FIGS. 14A-14C are cross-sectional views illustrating a method of manufacturing a graphene-containing device, according to another exemplary embodiment.

Referring to FIG. 14A, an underlayer 1320 and a multilayer graphene 1330 may be formed on a first substrate 1310. The multilayer graphene 1330 may be a bilayer graphene having a bandgap. According to desired characteristics, the multilayer graphene 1330 may be a multilayer graphene including three or more layers. The method of forming the underlayer 1320 and the multilayer graphene 1330 on the first substrate 1310 may be the same as or similar to the method described with reference to FIGS. 1A-9F.

Referring to FIG. 14B, the multilayer graphene 1330 of the first substrate 1310 may be transferred to a second substrate 1340. This may be the same as or similar to the transferring method described with reference to FIG. 13B. The second substrate 1340 may be formed from a material that is the same as or similar to that used to form the second substrate 1040 of FIG. 13B.

Referring to FIG. 14C, a device unit including the multilayer graphene 1330 may be formed on the second substrate 1340. According to the present exemplary embodiment, a source electrode 1350 and a drain electrode 1360 may be formed to contact both ends of the multilayer graphene 1330, respectively. Then, a gate insulating layer 1370 may be formed to cover the source electrode 1350, the drain electrode 1360, and the multilayer graphene 1330 therebetween, and a gate electrode 1380 may be formed on the gate insulating layer 1370. The gate electrode 1380 may be disposed above or directly above the multilayer graphene 1330.

The device 1300 of FIG. 14C may be a transistor, and the multilayer graphene 1330 may be used as a channel layer in the transistor. The multilayer graphene 1330 may have a pnp or npn junction structure. When the multilayer graphene 1330 has a pnp junction structure, the source electrode 1350 and the drain electrode 1360 may contact different p-type regions of the multilayer graphene 1330, respectively. When the multilayer graphene 1330 has an npn junction structure, the source electrode 1350 and the drain electrode 1360 may contact different n-type regions of the multilayer graphene 1330, respectively. The device 1300 of FIG. 14C may be a top-gate transistor in which the gate electrode 1380 is disposed over the multilayer graphene (in this example, a channel layer) 1330.

Figure 15A:
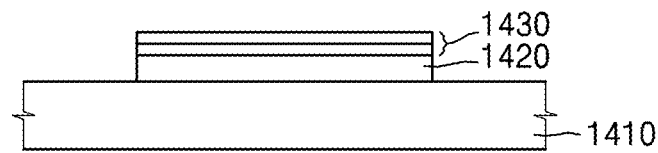
FIGS. 15A-15C are cross-sectional views illustrating a method of manufacturing a graphene-containing device, according to another exemplary embodiment.
Figure 15B:
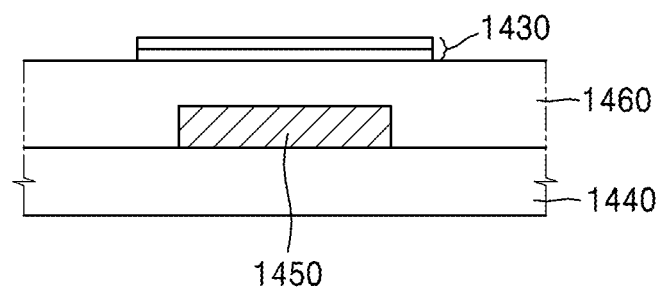
Figure 15C:
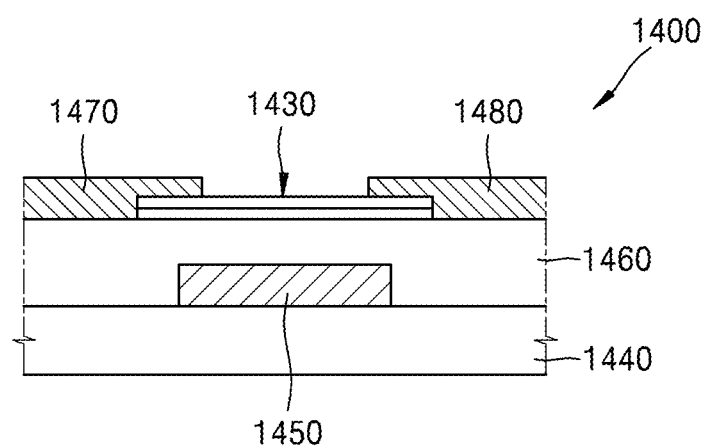

FIGS. 15A-15C are cross-sectional views illustrating a method of manufacturing a graphene-containing device, according to another exemplary embodiment.

Referring to FIG. 15A, an underlayer 1420 and a multilayer graphene 1430 may be formed on a first substrate 1410. This structure is the same as or similar to the structure of FIG. 14A.

Referring to FIG. 15B, after a gate electrode 1450 is formed on the second substrate 1440 and a gate insulating layer 1460 is formed to cover the gate electrode 1450, the multilayer graphene 1430 of the first substrate 1410 may be transferred to the gate insulating layer 1460. The method of transferring the multilayer graphene 1430 may be the same as or similar to the transferring method described above with reference to FIG. 13B.

Referring to FIG. 15C, a source electrode 1470 and a drain electrode 1480 may be formed on the gate insulating layer 1460 to contact both ends of the multilayer graphene 1430, respectively. The device 1400 of FIG. 15C may be a bottom-gate transistor, and the multilayer graphene 1430 may be a channel layer in the bottom-gate transistor. The multilayer graphene 1430 may have a pnp or npn junction structure.

Figure 16A:
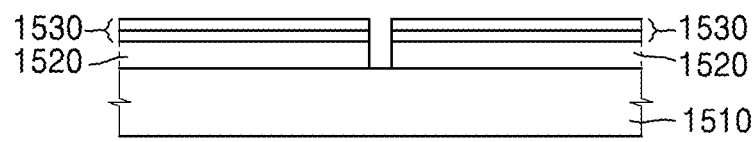
FIGS. 16A-16C are cross-sectional views illustrating a method of manufacturing a graphene-containing device, according to another exemplary embodiment.
Figure 16B:
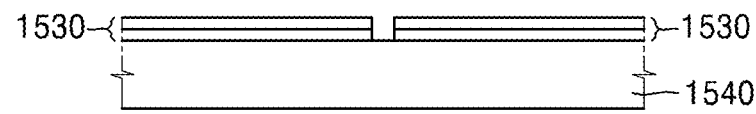
Figure 16C:
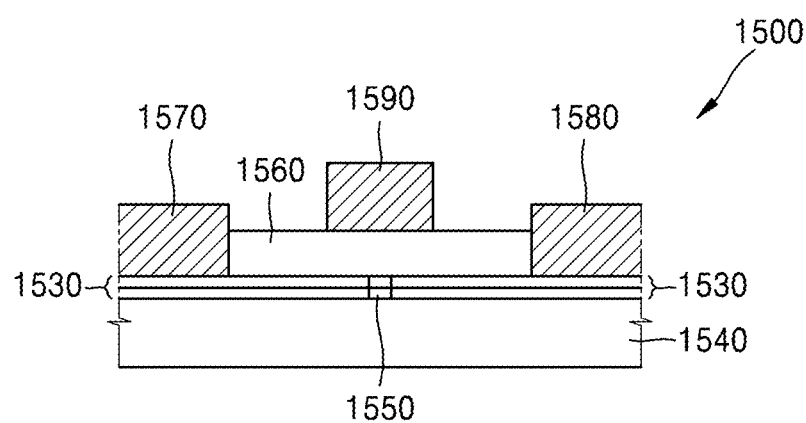

FIGS. 16A-16C are cross-sectional views illustrating a method of manufacturing a graphene-containing device, according to another exemplary embodiment.

Referring to FIG. 16A, a plurality of underlayers 1520 may be formed on a first substrate 1510, and a plurality of multilayer graphenes 1530 may be formed on the plurality of underlayers 1520. Each multilayer graphene 1530 may be a bilayer graphene having a bandgap. According to desired characteristics, the multilayer graphene 1530 may be a multilayer graphene including three or more layers. The structure of FIG. 16A may be obtained using a method that is the same as or similar to that described above with reference to FIGS. 10A-10C.

Referring to FIG. 16B, the plurality of multilayer graphenes 1530 of the first substrate 1510 may be transferred to a second substrate 1540. This may be the same as or similar to the transferring method of FIG. 13B.

Referring to FIG. 16C, a device unit including the plurality of multilayer graphenes 1530 may be formed on the second substrate 1540. According to the present exemplary embodiment, after a tunneling layer 1550 is formed to fill an area between the plurality of multilayer graphenes 1530, a gate insulating layer 1560 may be formed on the tunneling layer 1550 and the plurality of multilayer graphenes 1530. Then, a gate electrode 1590 may be formed on the gate insulating layer 1560, and a source electrode 1570 and a drain electrode 1580 may be electrically connected to (contact) to the multilayer graphenes 1530, respectively. The tunneling layer 1550 may have a material and width that enable Fowler-Nordheim (F-N) tunneling of charge to occur. For example, the tunneling layer 1550 may have a width of several nm to several tens of nm.

A device of FIG. 16C may be a field effect transistor (FET) using a tunneling effect. In this respect, the device 1500 of FIG. 16C may be referred to as a sort of tunneling device.

According to an exemplary embodiment, since the interval between two multilayer graphenes 1530 may be easily controlled up to a level of several tens of nm to several nm, a device having a structure as shown in FIG. 16C may be easily manufactured. Since the two multilayer graphenes 1530 are grown on a patterned underlayer (i.e., the underlayers 1520 of FIG. 16A), the edge portions of the two multilayer graphenes 1530 may have defect-free crystal structures, and accordingly the device may have an improved performance.

Although the method of transferring a multilayer graphene from a first substrate to a second substrate and then manufacturing a graphene-containing device on the second substrate has been illustrated and described with respect to FIGS. 13A-16C, the graphene-containing device may be manufactured on the first substrate without a transferring operation. This case is illustrated in FIGS. 17A and 17B.

Figure 17A:
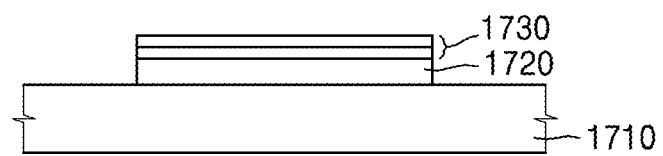
FIGS. 17A and 17B are cross-sectional views illustrating a method of manufacturing a graphene-containing device, according to another exemplary embodiment.
Figure 17B:
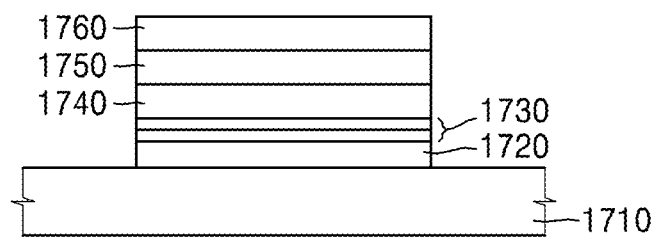

FIGS. 17A and 17B are cross-sectional views illustrating a method of manufacturing a graphene-containing device, according to another exemplary embodiment.

Referring to FIG. 17A, an underlayer 1720 and a multilayer graphene 1730 may be formed on a first substrate 1710. This structure is the same as or similar to the structure of FIG. 13A. The underlayer 1720 may be a conductive layer (e.g., a metal layer), and the multilayer graphene 1730 may be a semiconductor layer including a pn junction. Hereinafter, the underlayer 1720 is referred to as a first conductive layer.

Referring to FIG. 17B, a device unit including the multilayer graphene 1730 may be formed on the first substrate 1710. The multilayer graphene 1730 may be a bilayer graphene having a bandgap. According to desired characteristics, the multilayer graphene 1730 may be a multilayer graphene including three or more layers. According to the present exemplary embodiment, a second conductive layer 1740, an insulating layer 1750, and a third conductive layer 1760 may be sequentially formed on the multilayer graphene 1730.

The device of FIG. 17B may be a tunneling device. The multilayer graphene 1730 may be a tunneling layer. The first conductive layer (i.e., the underlayer 1720) may be a drain electrode, the second conductive layer 1740 may be a source electrode, and the third conductive layer 1760 may be a gate electrode. The insulating layer 1750 may be a gate insulating layer. The third conductive layer 1760 may control the electrical characteristics of the multilayer graphene 1730 or control electrical characteristics of an interface between the second conductive layer 1740 and the multilayer graphene 1730. Due to the tunneling of a charge via the multilayer graphene 1730, current may flow between the first conductive layer (i.e., the underlayer 1720) and the second conductive layer 1740.

A multilayer graphene according to exemplary embodiments is applicable to various devices (such as semiconductor devices and electronic devices) for several purposes. For example, a multilayer graphene according to an exemplary embodiment is applicable to various devices, such as diodes, transistors, tunneling devices, memory devices, solar cells, photodetectors, sensors, light emitting devices, logic devices, energy storage devices, and display devices. The transistors may include field effect transistors (FET), thin film transistors (TFT), binary junction transistors (BJT), barrier transistors (i.e., a barristor), or the like. The sensors may be, for example, light sensors, gas sensors, or sensors using a graphene array. The multilayer graphene according to an exemplary embodiment is applicable to any device using a pn junction, and may be used instead of Si in an existing Si-using device. The multilayer graphene is applicable to, for example, a stackable device, a flexible device, or a transparent device. Since the multilayer graphene according to an exemplary embodiment may be flexible and may have transparent characteristics, the multilayer graphene is usefully and favorably applicable to flexible devices and transparent devices. A device including the multilayer graphene according to an exemplary embodiment is also applicable to various integrated circuits.

Figure 18:
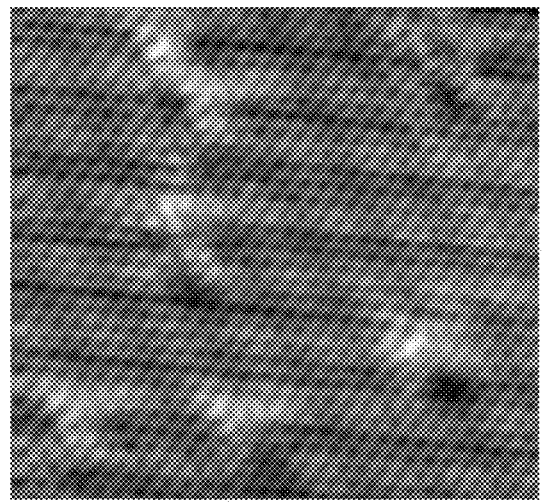
FIG. 18 is a scanning tunneling microscopy (STM) image showing a Ni-doped monolayer graphene.

FIG. 18 is a scanning tunneling microscopy (STM) image showing a Ni-doped monolayer graphene formed according to the above-described exemplary embodiments. Referring to FIG. 18, the graphene monoatomic layer is doped with Ni.

Figure 19:
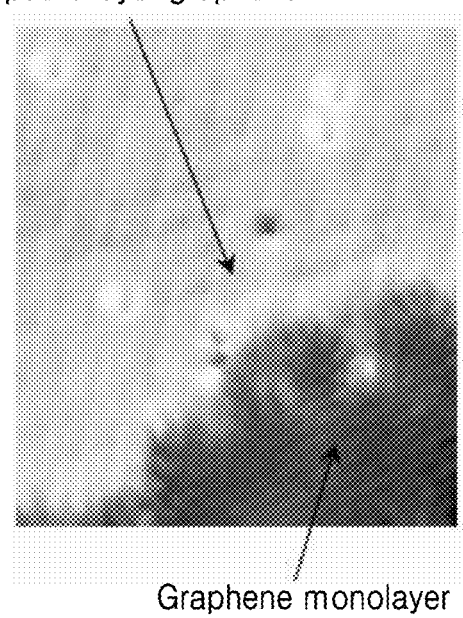
FIG. 19 is an STM image showing an n-type bilayer graphene manufactured according to an exemplary embodiment.

FIG. 19 is an STM image showing a Ni-doped bilayer graphene formed on a monolayer graphene layer according to the above-described exemplary embodiments.

FIGS. 20-24 show chemical structures of various source gases that may be used to form a multilayer graphene in certain exemplary embodiments.

Figure 20:
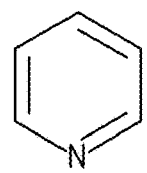
FIGS. 20-24 show chemical structures of various source gases that may be used to form a multilayer graphene in exemplary embodiments.
Figure 21:
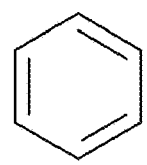
Figure 22:
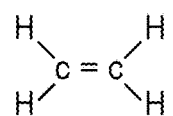
Figure 23:
Figure 24:
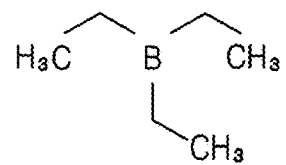

FIG. 20 shows the chemical structure of pyridine ($C_5H_5N$), FIG. 21 shows the chemical structure of benzene ($C_6H_6$), FIG. 22 shows the chemical structure of ethylene ($C_2H_4$), FIG. 23 shows the chemical structure of acetylene ($C_2H_2$), and FIG. 24 shows the chemical structure of triethylborane ($C_6H_{15}B$). Materials as shown in FIGS. 20-24 may be used in the multilayer graphene forming methods described above with reference to FIGS. 1A-9F. However, the material (source gas) that may be used in an exemplary embodiment is not limited to those shown in FIGS. 20-24, and various other materials may be used.

While exemplary embodiments have been particularly shown and described, it should be understood that the exemplary embodiments are descriptive only and do not limit the present disclosure. For example, it will be understood by one of ordinary skill in the art that various changes in form and details may be made in the graphene layer forming methods of FIGS. 1A-9F without departing from the spirit and scope of the following claims. Various changes in form and details may also be made in the multilayer graphene structure of FIGS. 10A-11, the graphene-containing devices of FIGS. 12-17B, and a method of manufacturing the graphene-containing devices. For example, a first multilayer graphene (e.g., a p-type multilayer graphene) and a second multilayer graphene (e.g., an n-type multilayer graphene) of a multilayer graphene may not be directly joined to each other, the shape of the multilayer graphene may have a shape other than a rectangle, and a portion of the multilayer graphene may be a monolayer instead of a bilayer or may be a multilayer including three or more layers.

Descriptions of features or aspects within each exemplary embodiment should typically be considered as being available for other similar features or aspects in other exemplary embodiments.

What is claimed is:

1. A method of forming a multilayer graphene, the method comprising:
   forming a first graphene on an underlayer;
   forming a first multilayer graphene on a first area of the first graphene at a first temperature by using a first source gas, the first multilayer graphene comprising a portion of the first graphene corresponding to the first area; and
   forming a second multilayer graphene on a second area of the first graphene adjacent to the first area at a second temperature by using a second source gas, the second multilayer graphene comprising a portion of the first graphene corresponding to the second area,
   wherein the first temperature is different from the second temperature.

2. The method of claim 1, wherein the first graphene is a monolayer graphene.

3. The method of claim 2, wherein at least one of the first multilayer graphene and the second multilayer graphene is a bilayer graphene.

4. The method of claim 1, wherein one of the first multilayer graphene and the second multilayer graphene is a p-type multilayer graphene and the other one of the first multilayer graphene and the second multilayer graphene is an n-type multilayer graphene, and
the first multilayer graphene and the second multilayer graphene form a pn junction.

5. The method of claim 1, wherein the first source gas is the same as the second source gas.

6. The method of claim 5, wherein each of the first source gas and the second source gas comprises a nitrogen (N)-containing hydrocarbon compound.

7. The method of claim 6, wherein the N-containing hydrocarbon compound comprises pyridine ($C_5H_5N$).

8. The method of claim 6, wherein the first temperature is about 700° C. or greater, and
the second temperature is about 550° C. or less.

9. The method of claim 8, wherein the first graphene is formed at the first temperature by using the first source gas.

10. The method of claim 8, wherein the first multilayer graphene is a p-type multilayer graphene, and
the second multilayer graphene is an n-type multilayer graphene.

11. The method of claim 4, wherein the first multilayer graphene is formed as the p-type multilayer graphene due to a doping effect of the underlayer, and
the second multilayer graphene is formed as the n-type multilayer graphene due to an n-type dopant included in the second source gas.

12. The method of claim 1, wherein the first source gas is different from the second source gas.

13. The method of claim 12, wherein one of the first source gas and the second source gas comprises a first hydrocarbon compound and the other one of the first source gas and the second source gas comprises a second hydrocarbon compound, and
the first hydrocarbon compound does not contain N, and the second hydrocarbon compound contains N.

14. The method of claim 4, further comprising forming a third multilayer graphene joined to the first multilayer graphene or the second multilayer graphene,
wherein the third multilayer graphene is a p-type multilayer graphene or an n-type multilayer graphene.

15. The method of claim 14, wherein each of the first through third multilayer graphenes has a pnp or npn structure.

16. The method of claim 1, wherein the first multilayer graphene and the second multilayer graphene are both of a p-type conductive type or an n-type conductive type and have doping concentrations different from each other.

17. The method of claim 16, wherein the first source gas is the same as the second source gas.

18. The method of claim 17, wherein each of the first source gas and the second source gas comprises an N-containing hydrocarbon compound.

19. The method of claim 18, wherein the N-containing hydrocarbon compound comprises pyridine ($C_5H_5N$).

20. The method of claim 18, wherein the first temperature is about 550° C. to about 800° C., and
the second temperature is about 550° C. or less.

21. The method of claim 20, wherein the first graphene is formed at the first temperature by using the first source gas.

22. The method of claim 18, wherein the first multilayer graphene is an n-type multilayer graphene, and
the second multilayer graphene is an n+-type multilayer graphene.

23. The method of claim 1, wherein the first multilayer graphene is formed using a first mask that exposes the first area of the first graphene, and
the second multilayer graphene is formed using a second mask that exposes the second area of the first graphene.

24. The method of claim 1, wherein the first and second multilayer graphenes are randomly distributed.

25. The method of claim 1, wherein the underlayer comprises a catalyst metal.

26. The method of claim 25, wherein the catalyst metal comprises platinum (Pt) or gold (Au).

27. The method of claim 1, further comprising forming the underlayer by forming a first material layer on a substrate, and forming a plurality of underlayers spaced apart from one another by patterning the first material layer.

28. A method of forming a multilayer graphene, the method comprising:
forming a first graphene on an underlayer;
forming a first multilayer graphene on a first area of the first graphene at a first temperature by using a first source gas, the first multilayer graphene comprising a portion of the first graphene corresponding to the first area; and
forming a second multilayer graphene on a second area of the first graphene adjacent to the first area at a second temperature by using a second source gas, the second multilayer graphene comprising a portion of the first graphene corresponding to the second area,
wherein the first source gas is different from the second source gas.

29. The method of claim 28, wherein the first graphene is a monolayer graphene.

30. The method of claim 29, wherein at least one of the first multilayer graphene and the second multilayer graphene is a bilayer graphene.

31. The method of claim 28, wherein one of the first source gas and the second source gas comprises a first hydrocarbon compound and the other one of the first source gas and the second source gas comprises a second hydrocarbon compound, and
the first hydrocarbon compound does not contain nitrogen (N), and the second hydrocarbon compound contains N.

32. The method of claim 31, wherein the first multilayer graphene is formed as a p-type multilayer graphene by the first hydrocarbon compound, and
the second multilayer graphene is formed as an n-type multilayer graphene by the second hydrocarbon compound.

33. The method of claim 32, wherein the first hydrocarbon compound comprises at least one of benzene ($C_6H_6$), ethylene ($C_2H_4$), acetylene ($C_2H_2$), and triethylborane ($C_6H_{15}B$).

34. The method of claim 32, wherein the first hydrocarbon compound contains boron (B).

35. The method of claim 32, wherein the second hydrocarbon compound comprises pyridine ($C_6H_5N$).

36. The method of claim 31, wherein the first graphene is formed using the first hydrocarbon compound.

37. A method of forming a multilayer graphene, the method comprising:
forming a first graphene on an underlayer; and
forming a multilayer graphene on a first area of the first graphene at a first temperature by using a first source gas, the multilayer graphene comprising a portion of the first graphene corresponding to the first area, wherein a temperature used to form the first graphene is different from the first temperature, or a source gas used to form the first graphene is different from the first source gas.

38. The method of claim 37, wherein the multilayer graphene is a bilayer graphene.

39. The method of claim 37, wherein one of the first graphene and the multilayer graphene is a p-type multilayer graphene and the other one of the first graphene and the multilayer graphene is an n-type multilayer graphene, and
the first graphene and the multilayer graphene form a pn junction.

40. A method of manufacturing a graphene-containing device, the method comprising:
forming a first graphene on an underlayer;
forming a first multilayer graphene on a first area of the first graphene at a first temperature by using a first source gas, the first multilayer graphene comprising a portion of the first graphene corresponding to the first area;
forming a second multilayer graphene on a second area of the first graphene adjacent to the first area at a second temperature by using a second source gas, the second multilayer graphene comprising a portion of the first graphene corresponding to the second area; and
forming a device unit comprising the multilayer graphene,
wherein the first temperature is different from the second temperature.

41. The method of claim 40, wherein the multilayer graphene is formed on a first substrate, and
the device unit is formed on the second substrate after the multilayer graphene has been transferred from the first substrate to a second substrate.

42. The method of claim 40, wherein the multilayer graphene is formed on a first substrate, and
the device unit is formed on the first substrate.

43. A graphene-containing device comprising a multilayer graphene formed by using a method comprising:
forming a first graphene on an underlayer;
forming a first multilayer graphene on a first area of the first graphene at a first temperature by using a first source gas, the first multilayer graphene comprising a portion of the first graphene corresponding to the first area; and
forming a second multilayer graphene on a second area of the first graphene adjacent to the first area at a second temperature by using a second source gas, the second multilayer graphene comprising a portion of the first graphene corresponding to the second area,
wherein the first temperature is different from the second temperature.

44. The graphene-containing device of claim 43, wherein the graphene-containing device is a diode, and
the graphene-containing device comprises a first electrode connected to the first multilayer graphene and a second electrode connected to the second multilayer graphene.

45. The graphene-containing device of claim 43, wherein the graphene-containing device is a transistor, and
the multilayer graphene is a channel layer.

46. The graphene-containing device of claim 45, wherein the multilayer graphene has a pnp or npn structure.

47. The graphene-containing device of claim 43, wherein the graphene-containing device comprises one of a tunneling device, a binary junction transistor (BJT), a barristor, a field effect transistor (FET), a memory device, a solar cell, a photodetector, a sensor, and a light-emitting device.

48. A graphene device comprising a multilayer graphene, the multilayer graphene comprising:
an n-type multilayer graphene formed on a first area; and
a p-type multilayer graphene formed on a second area adjacent to the first area,
wherein the n-type multilayer graphene has a crystal structure in which some of carbon (C) atoms are replaced by first atoms, and
the p-type multilayer graphene has a crystal structure including only C atoms or has a crystal structure in which a plurality of C atoms are replaced by second atoms different from the first atoms.

49. The graphene device of claim 48, wherein the multilayer graphene is a bilayer graphene.

50. The graphene device of claim 48, wherein the first atoms are N atoms.

51. A method of forming a defect-free junction between edge portions of graphene sheets comprising:
forming a first graphene on an underlayer;
forming a second graphene between the first graphene and the underlayer by exposing a first area of the first graphene to a first temperature above about 450° C. and a first source gas comprising a hydrocarbon compound;
forming a third graphene between the first graphene and the underlayer by exposing a second area of the first graphene to a second temperature above about 450° C. and a second source gas comprising a hydrocarbon compound,
wherein the third graphene is in direct contact with an edge portion of the second graphene, and
wherein the second area of the first graphene does not include any of the first area of the first graphene.

* * * * *